United States Patent [19]

Kusunoki

[11] Patent Number: 5,324,678
[45] Date of Patent: Jun. 28, 1994

[54] METHOD OF FORMING A MULTI-LAYER TYPE SEMICONDUCTOR DEVICE WITH SEMICONDUCTOR ELEMENT LAYERS STACKED IN OPPOSITE DIRECTIONS

[75] Inventor: Shigeru Kusunoki, Hyogo, Japan

[73] Assignee: Mitsubishi Denki Kabushiki Kaisha, Tokyo, Japan

[21] Appl. No.: 983,022

[22] Filed: Nov. 30, 1992

Related U.S. Application Data

[62] Division of Ser. No. 585,462, Sep. 20, 1990, Pat. No. 5,189,500.

[30] Foreign Application Priority Data

Sep. 22, 1989 [JP] Japan .................................. 1-247156

[51] Int. Cl.$^5$ ..................... H01L 21/70; H01L 21/304
[52] U.S. Cl. .......................................... 437/51; 437/62
[58] Field of Search .................. 437/51, 62, DIG. 135

[56] References Cited

U.S. PATENT DOCUMENTS

| | | | |
|---|---|---|---|
| 3,508,980 | 4/1970 | Jackson, Jr. et al. ................ | 437/86 |
| 4,272,880 | 6/1981 | Pashley . | |
| 4,651,001 | 3/1987 | Harada et al. . | |
| 4,870,475 | 9/1989 | Endo et al. . | |
| 4,899,204 | 2/1990 | Rosen et al. . | |
| 4,939,568 | 7/1990 | Kato et al. . | |
| 5,034,343 | 6/1991 | Rouse et al. ......................... | 437/62 |
| 5,102,821 | 4/1992 | Moslehi ................................ | 437/62 |
| 5,123,975 | 6/1992 | Irinoda et al. ....................... | 437/62 |
| 5,168,078 | 12/1992 | Reisman et al. ......... | 148/DIG. 135 |

OTHER PUBLICATIONS

Maszara et al., "Wafer Bonding for SOI", *Mat. Res. Soc. Symp. Proc.*, vol. 107 (1988), pp. 489–494.
Nishimura et al., "Three Dimensional IC for High Performance Image Signal Processor" *Proceedings of the IEDM-International Electron Devices Meeting* (1987), pp. 111–114.
Ahn et al., "Dissolution and Disintegration of Uniform SiO$_2$ Layer During Direct Silicon Wafer Bonding", *Mat Res. Soc. Symp. Proc.*, vol. 107, pp. 501–506 (1988).
Furukawa et al., "Applications of the Silicon Wafer Direct-Bonding Technique to Electron Devices", *Applied Surface Science* 41/42 (1989), pp. 627–632.
Furukawa, Silicon-on-Insulator: Its Technology and Applications, *Proceedings of the IEDM-International Electron Devices Meeting* (1987), pp. 111–114.

*Primary Examiner*—Brian E. Hearn
*Assistant Examiner*—Linda J. Fleck
*Attorney, Agent, or Firm*—Lowe, Price, LeBlanc & Becker

[57] ABSTRACT

A multi-layer type semiconductor device is disclosed, in which a plurality of semiconductor layers are formed in vertically opposite directions. The multi-layer type semiconductor device is obtained by forming a first semiconductor layer, an insulating layer and a second semiconductor layer in the mentioned order on a main surface of a first substrate, forming a semiconductor device by using the second semiconductor layer as a base, with an exposed surface thereof directed upward, forming an insulating film on the semiconductor device, attaching a second substrate to the insulating film, thinning the first substrate to expose the first semiconductor layer, and forming a further semiconductor device by using the first semiconductor layer as a base, with an exposed surface of the first semiconductor layer directed upward. A single-chip type image forming system or sensing system may be provided by employing, as the semiconductor devices, a sensing device such as a photosensor, a pressure sensor or the like, a processing circuit for processing a signal received from the sensor, and a display device for displaying results of the processing. A large number of pads may be provided by arranging the pads on opposite surfaces of a chip.

3 Claims, 24 Drawing Sheets

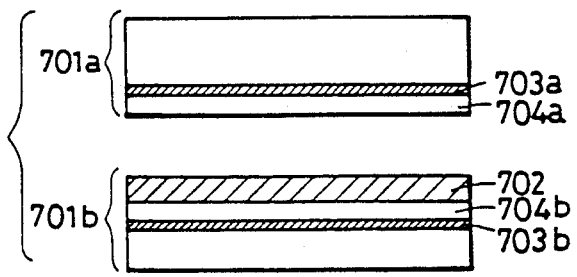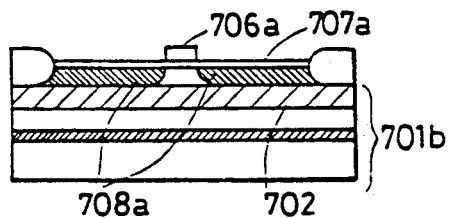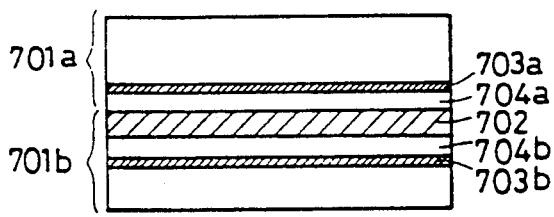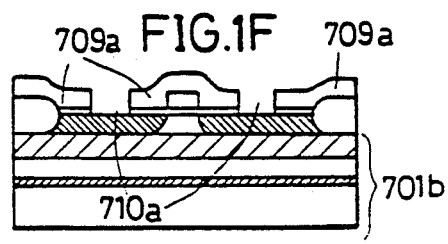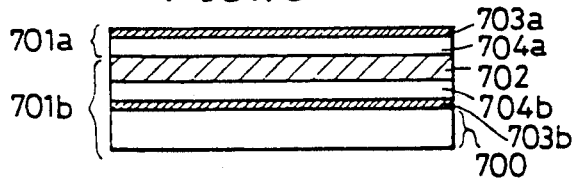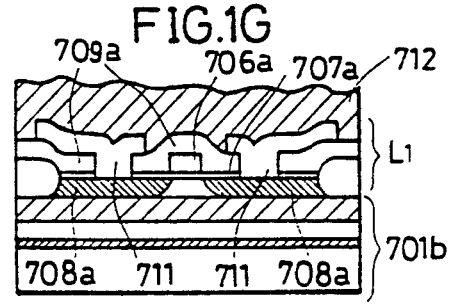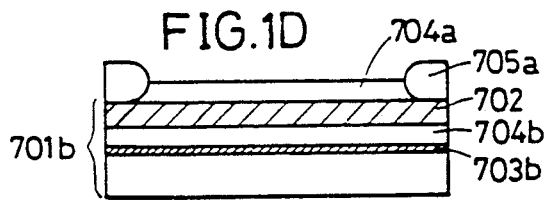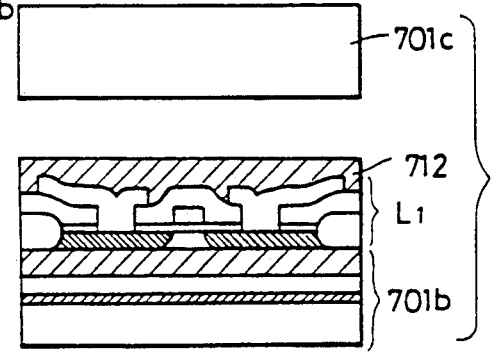

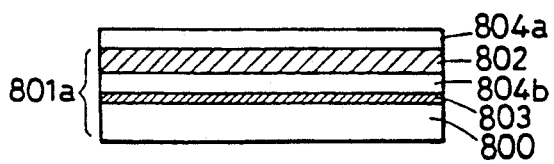
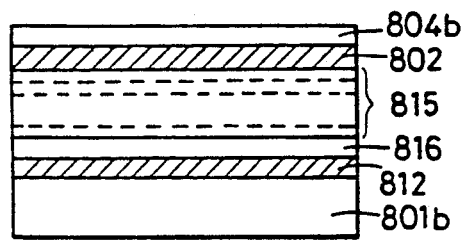
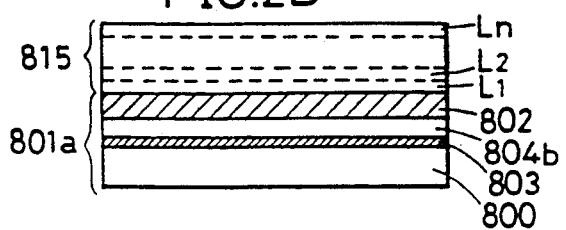
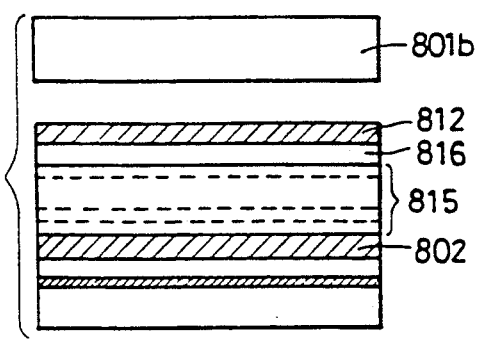
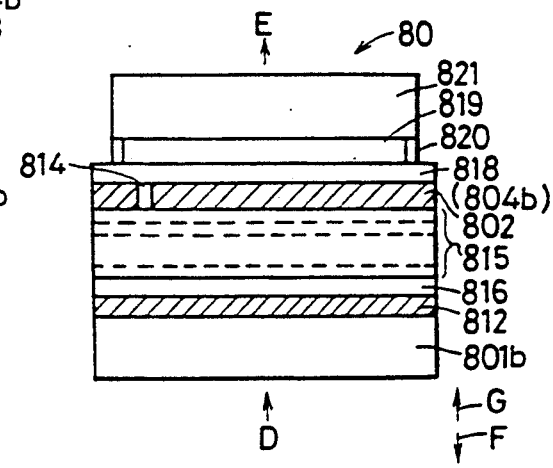
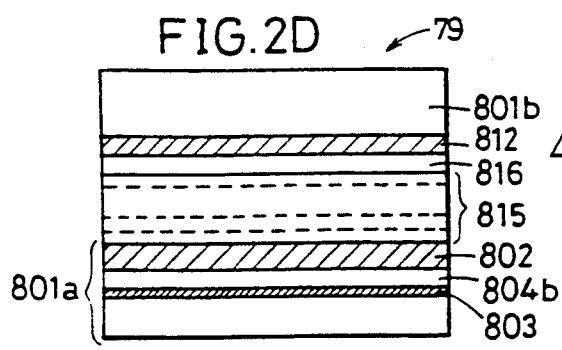
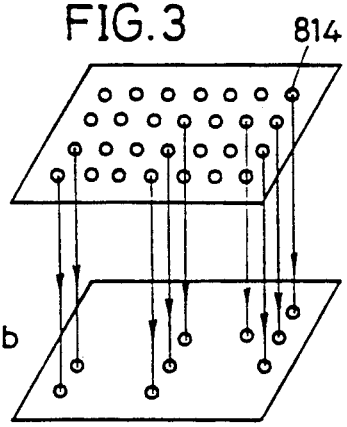

BRIGHT ↕ DARK

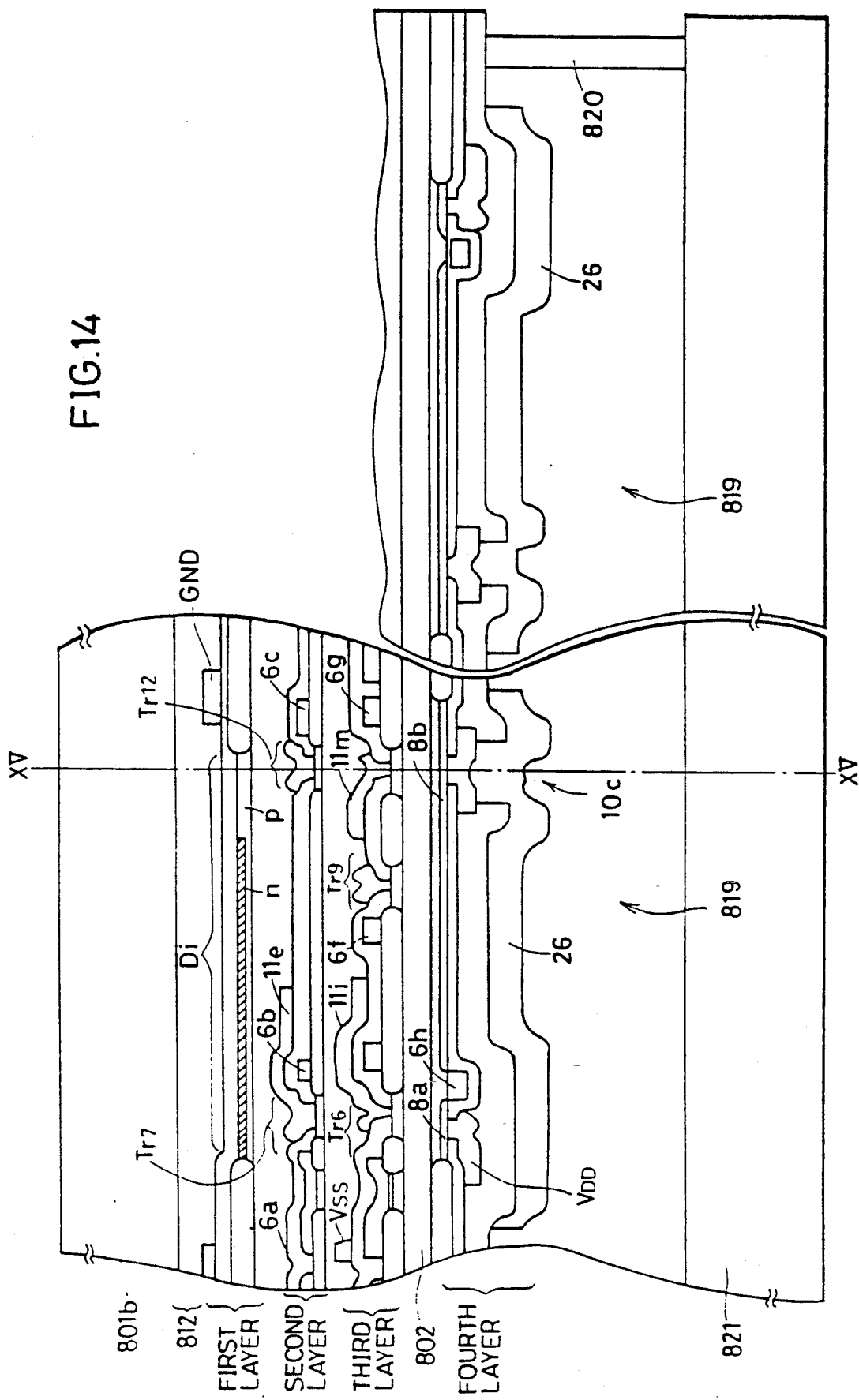

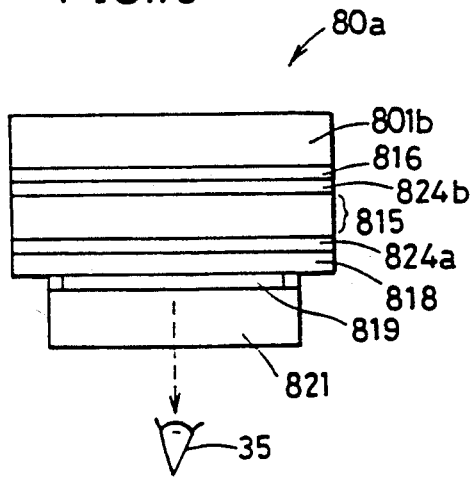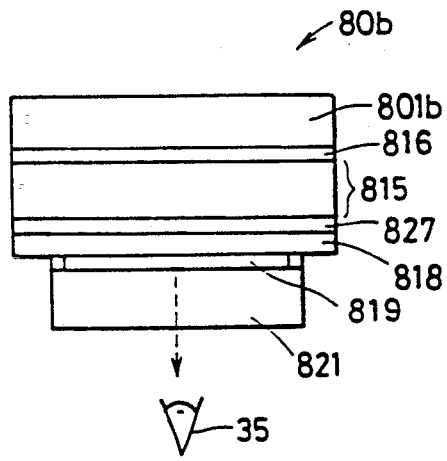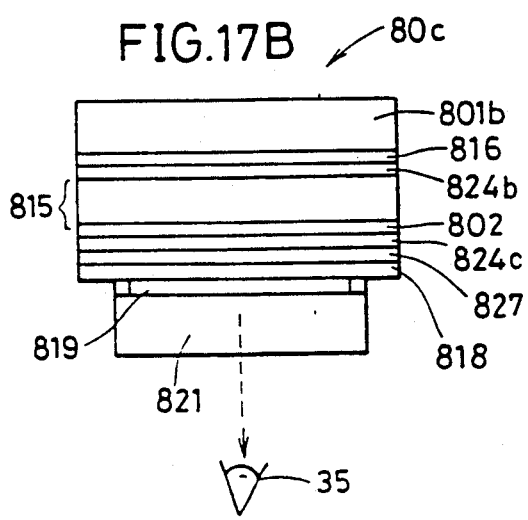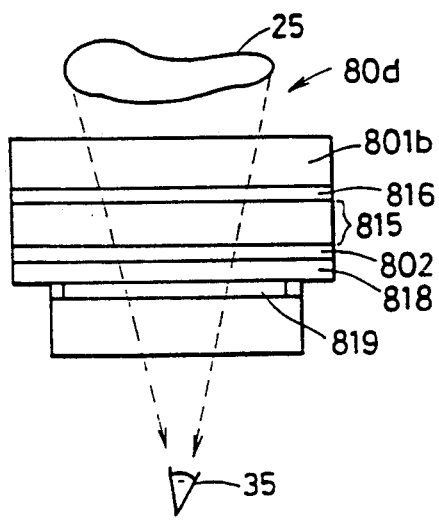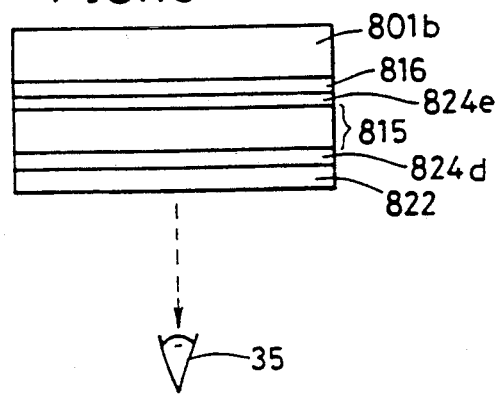

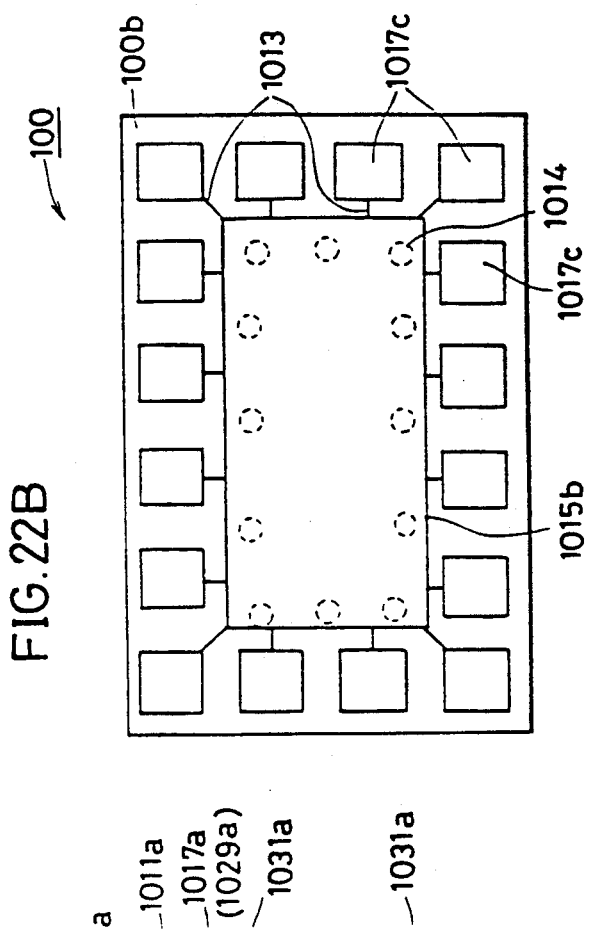
FIG. 22A
FIG. 22B
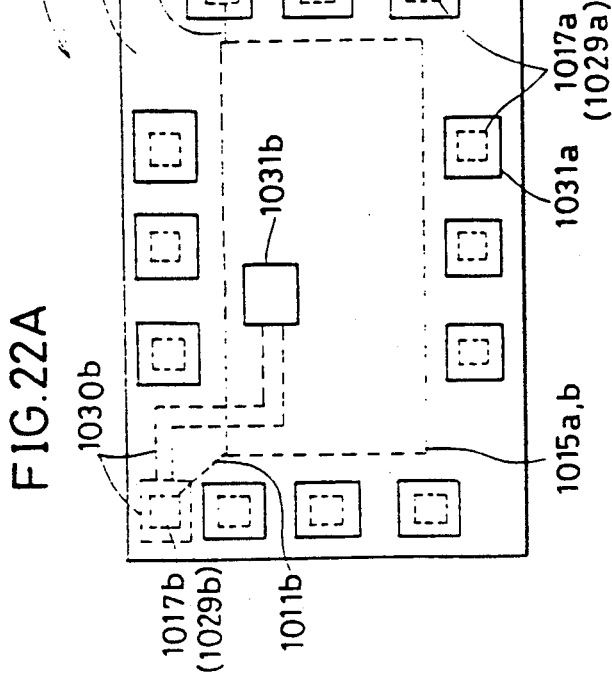
FIG. 22C

FIG. 24A BACKGROUND ART
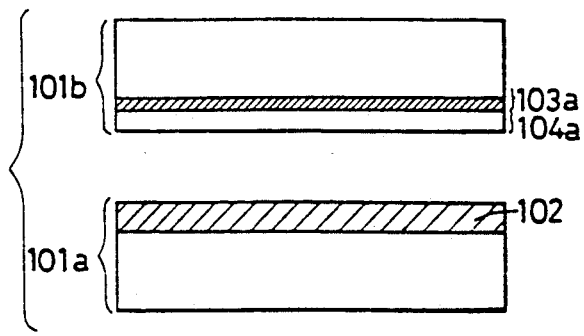
FIG. 24B BACKGROUND ART
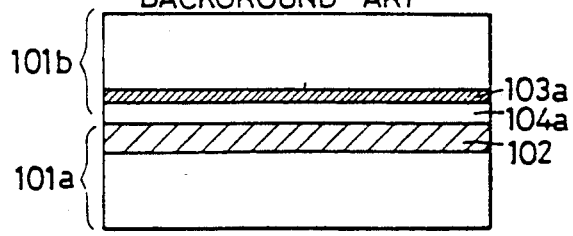
FIG. 24C BACKGROUND ART
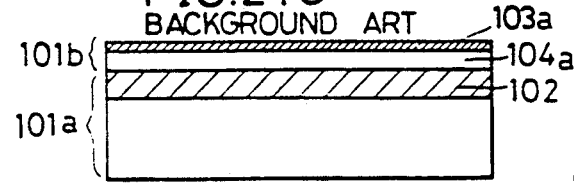
FIG. 24D BACKGROUND ART
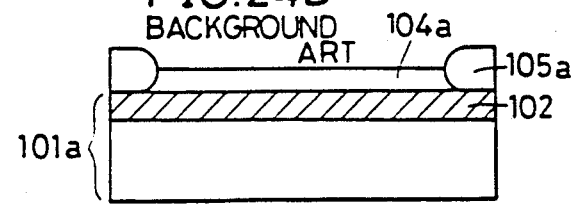
FIG. 24E BACKGROUND ART
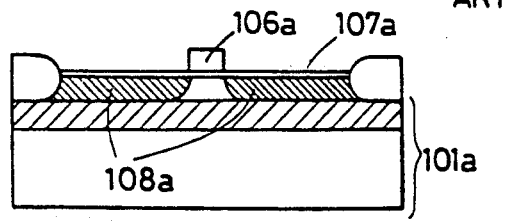
FIG. 24F BACKGROUND ART
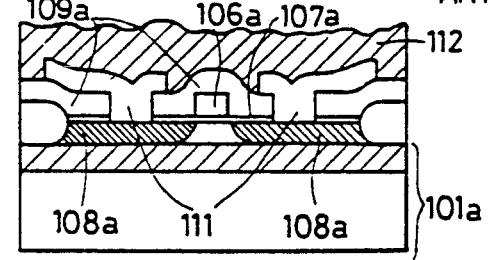
FIG. 24G BACKGROUND ART
FIG. 24H BACKGROUND ART
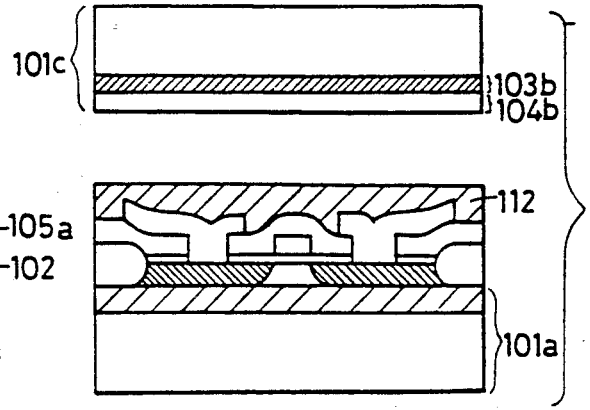

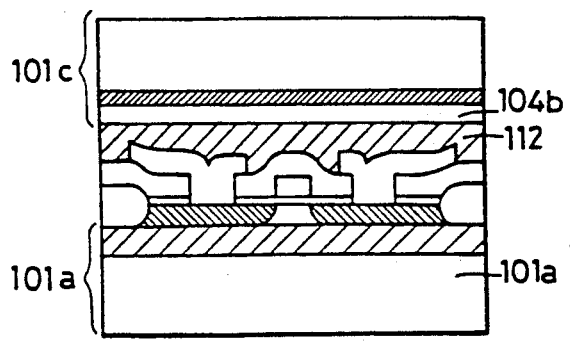
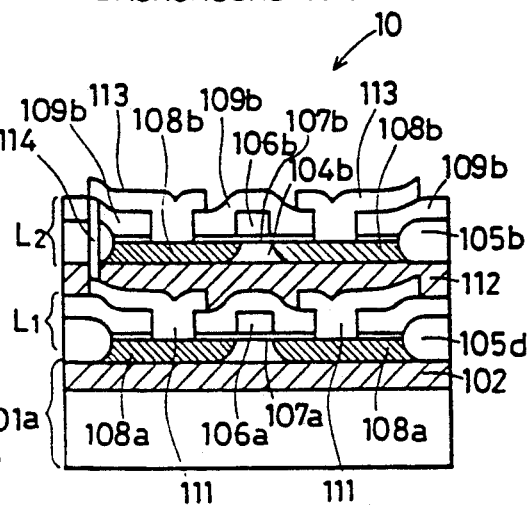
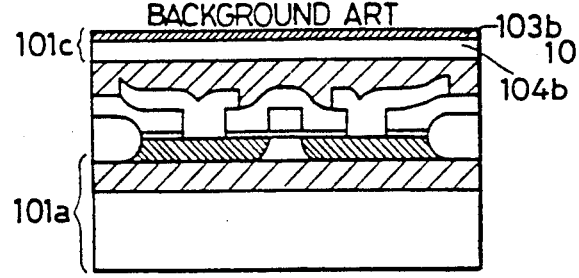
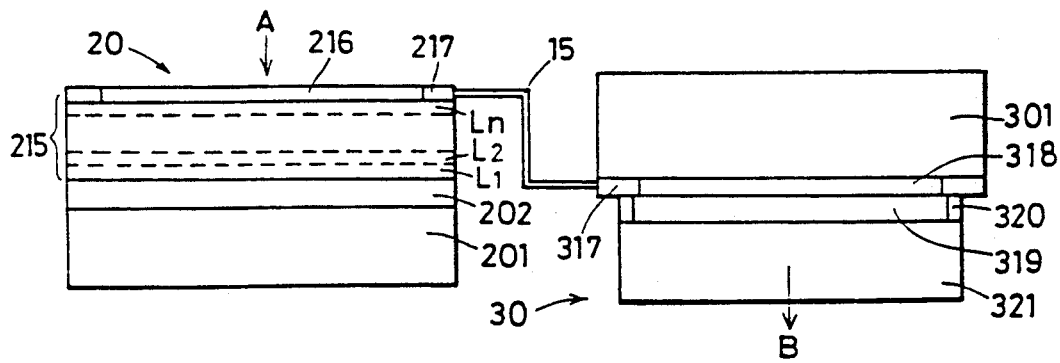
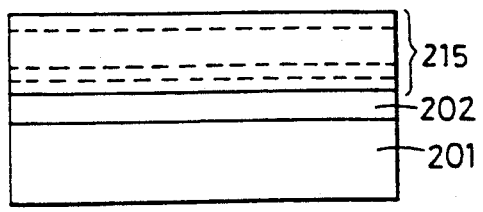
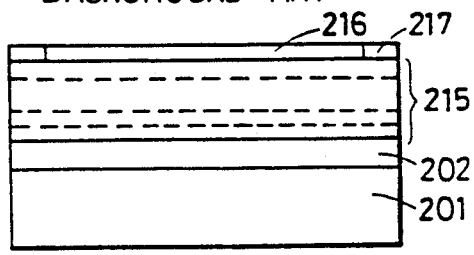

METHOD OF FORMING A MULTI-LAYER TYPE SEMICONDUCTOR DEVICE WITH SEMICONDUCTOR ELEMENT LAYERS STACKED IN OPPOSITE DIRECTIONS

This application is a divisional application of application Ser. No. 07/585,462, filed Sep. 20, 1990, now U.S. Pat. No. 5,189,500.

BACKGROUND OF THE INVENTION

1. Field of the Invention

This invention relates to multi-layer type semiconductor devices, and more particularly to multi-layer type semiconductor devices having semiconductor element layers stacked in opposite directions. This invention relates also to methods of manufacturing such multi-layer type semiconductor devices. The invention has particular application in the field of image processing system fabricated on a single common multiple layer integrated circuit.

2. Description of the Background Art

An ordinary integrated circuit is formed on a surface of a wafer and has, so to speak, a two-dimensional structure. As distinct from this, an integrated circuit including a plurality of semiconductor layers having semiconductor elements and stacked one upon another is called a three-dimensional integrated circuit. Because of the multi-layer structure, the three-dimensional integrated circuit has the advantage of realizing a very high degree of integration and greatly improved functions.

Generally, the three-dimensional integrated circuit includes semiconductor layers and insulating layers stacked alternately, with each semiconductor layer having active elements formed therein. With the integrated circuit having active elements formed in the respective semiconductor layers formed on the insulating layers, the elements have only a small excess capacity, and hence a further advantage of enabling high speed operation of these elements.

The technique of forming semiconductor layers, particularly silicon layers, on insulating layers will be described next.

The technique of providing a structure in which silicon layers are formed on insulating layers is known as SOI (Silicon On Insulator) technique. A silicon layer formed on an insulating layer is called an SOI layer, and a structure having silicon layers formed on insulating layers an SOI structure. Such a technique is described, for example, in an article titled "Silicon-on-Insulator; Its Technology and Applications" edited by S. Furukawa and published by KTK Scientific Publishes in 1985.

As SOI techniques, methods are known which utilize epitaxy. These methods include a liquid phase epitaxy method such as a melting recrystallization method in which a polycrystalline or amorphous semiconductor layer formed on an insulating layer is exposed to and melted by energy light such as a laser beam, an electron beam or the like, and is thereafter allowed to solidify, a solid phase epitaxy method which causes an amorphous semiconductor layer to grow in solid phase, and a vapor phase epitaxy method which utilizes graphoepitaxy or bridging epitaxy. However, since these methods cause silicon crystals to grow on an insulating layer, it is difficult to obtain a single-crystal layer over a large area and to control film thickness compared with the case of causing silicon crystals to grow epitaxially on a single-crystal layer.

As a technique of obtaining the SOI structure, SIMOX (Separation by Implanted Oxygen) is known. SIMOX is a method of obtaining a structure having mutually separated semiconductor layers, in which ions such as of oxygen are injected in high concentration into a semiconductor layer to form a buried insulating layer. With this method, however, it is difficult to obtain a multi-layer structure, which makes this method hardly applicable for manufacture of a three-dimensional integrated circuit.

As another technique of obtaining the SOI structure, a wafer direct bonding method is known. Such a method is presented, for example, in "APPLICATIONS OF THE SILICON WAFER DIRECT-BONDING TECHNIQUE TO ELECTRON DEVICES" by K. Furukawa et al. in 1989 Applied Surface Science 41/42 at pp. 627-632. In the wafer direct bonding method, a wafer having an insulating layer formed on a surface thereof is superposed by a single-crystal wafer or a wafer having a single-crystal layer, and the two wafers are heat-treated (annealed) in an atmosphere of 600° to 1,000° C. The heat treatment induces an interatomic junction over containing surfaces, thereby bonding the wafers together. Then the upper wafer is thinned, to complete a semiconductor layer formed on the insulating layer. The semiconductor layer obtained on the insulating layer by the wafer direct bonding method is, by origin, a product of epitaxy formed on a single-crystal silicon substrate. Thus, this semiconductor layer has an excellent crystalline property and a uniform film thickness, to be suitable for manufacture of a three-dimensional integrated circuit.

A multi-layer type semiconductor device manufactured by the above wafer direct bonding method and forming the background of this invention will be described next.

FIGS. 24A through 24K are sectional views showing a process of manufacturing the multi-layer type semiconductor device forming the background of this invention.

Referring to FIG. 24A, a first silicon wafer 101a having a thickness of 500 to 600 μm includes an insulating layer 102 formed 1,000 to 10,000Å thick on a surface region thereof. A second silicon wafer 101b having a thickness corresponding to that of the first silicon wafer 101a includes, formed on a surface region thereof, a boron-injected layer 103a with boron injected thereinto in a high concentration on the order of $1 \times 10^{20}/cm^3$ and a low concentration epitaxial layer 104a having a thickness of about 5,000Å. Boron-injected layer 103 is used as etchant stopper for a subsequent process. The epitaxial layer 104a is obtained by causing silicon crystals to grow epitaxially on the single-crystal substrate 101b.

Referring to FIG. 24B, the two wafers 101a and 101b are placed in superposition with the insulating layer 102 and epitaxial layer 104a opposed so each other, and are heat-treated in an atmosphere of about 800° C. This heat treatment is called annealing. The annealing induces an interatomic junction over contacting surfaces, which bonds the two wafers 101a and 101b together. Next, an upper surface of one of the wafers 101b is coarsely polished until its thickness is reduced to 100 μm. Thereafter the wafer 101b is finely etched with a mixed liquid of hydrofluoric acid and nitric acid until its thickness is reduced to 10 μm.

Next, the wafer 101b is etched with an aqueous solution of ethylenediamine and pyrocatechol. The etching step using this aqueous solution is carried out at a rate of 1 μm/min. for semiconductor regions having a low concentration of boron, whereas the etching processes at a rate of 20Å/min. for regions the higher boron concentration. Consequently, the etching action stops at the high concentration boron-injected layer 103a. Thus, as shown in FIG. 24C, the water 101b is removed except the high concentration boron-injected layer 103a and epitaxial layer 104a. Next, to form semiconductor elements, the boron-injected layer 103a is etched away, and a surface thereby exposed is oxidized which is followed by a step of etching away an oxide film. This leaves a thin SOI layer 104a having a thickness on the order of 1,000Å.

Referring to FIG. 24D next, the field oxide layers 105a are formed by LOCOS (Local Oxidation of Silicon) in regions of the SOI layer 104a which are to serve as isolation regions.

Referring to FIG. 24E next, a gate insulating film 107a is formed by oxidation of the SOI layer 104, and a polysilicon layer is formed on the gate insulator film 107a. This polysilicon layer is patterned into a shape of a gate electrode 106a. Next, impurities are applied by ion implantation using the gate electrode 106a as a mask to form source and drain regions 108a.

Referring to FIG. 24F next, an interlayer insulating film 109a is formed over the entire surface, and contact holes 110 are formed through the interlayer insulating film 109a.

Referring to FIG. 24G next, refractory metal interconnections 111 a reformed as electrically connected to the source and drain regions 108a and extending onto the interlayer insulating films 109a. The gate electrode 106a, gate insulator film 107a and source and drain regions 108a constitute a transistor. Next, an insulating layer 112 is formed over the interlayer insulating film 109a and refractory metal interconnections 111.

Referring to FIG. 24H next, the insulating layer 112 is flattened for the purpose of superposition. Thereafter the flattened insulating layer 112 is superposed by a third silicon wafer 101c including a high concentration boron-injected layer 103b and an epitaxial layer 104b as does the second silicon wafer 101b. The two wafers are annealed in an atmosphere of about 800° C., whereby the wafers are bonded together through surfaces of the insulating layer 112 and epitaxial layer 104b as shown in FIG. 24I.

Next, as described hereinbefore, the wafer 101c is thinned by polishing and by etching with the mixed liquid of hydrofluoric acid and nitric acid. Further, the wafer 101c is etched with the aqueous solution of ethylenediamine and pyrocatechol. Consequently, as shown in FIG. 24J, the wafer 101c is removed except the high concentration boron-injected layer 103b and epitaxial layer 104b. The epitaxial layer 104b of the third silicon wafer 101c is used as a second SOI layer. Subsequently, to form semiconductor elements, the boron-injected layer 103a is etched away.

Referring to FIG. 24K next, field oxide layers 105b, a gate insulator film 107b, a gate electrode 106b, source and drain regions 108b, an interlayer insulating film 109b, and metal interconnections 113 comprising aluminum or an aluminum alloy are formed by using the second SOI layer 104b as a base, as described with reference to FIGS. 24D and 24E. The gate electrode 106b, gate insulator film 107b and source and drain regions 108b constitute a transistor. In this way, a first active layer L1 is formed on the semiconductor substrate 101a through the insulating layer 102, and a second active layer L2 on the first active layer L1 through the insulating layer 112. The transistor of the first active layer L1 and that of the second active layer L2 are electrically interconnected, as necessary, by conductors mounted in through holes 114.

The multi-layer type semiconductor device manufactured by the above method employs a refractory metal, instead of aluminum, for the metal interconnections of the first active layer. This is because the metal interconnections are exposed to the high temperature when the two wafers are bonded by annealing as shown in FIG. 24I. Thus, if a third active layer is formed on the second active layer, the aluminum interconnections of the second active layer L2 are replaced with the refractory metal interconnections.

In the foregoing multi-layer type semiconductor device, the active layers are stacked in a fixed directions on the basis of a surface of the semiconductor substrate. If a large number of layers are stacked, a distortion due to the fixed stacking direction becomes apparent, giving rise to the problems of fluctuating a threshold voltage and increasing leakage.

Further, since the active layers are stacked on only one surface of the substrate, the active layer close to the substrate is heated more frequently than the active layer or layers farther away from the substrate and, therefore, is required to have a better heat-resisting property.

An image process system employing the multi-layer type semiconductor device manufactured by the foregoing method will be described next. This image processing system includes a photodetecting portion for receiving light from an object, and a display portion for displaying a received optical signal as an image.

In such an image processing system, generally, the photodetecting portion and display portion are formed separately for the following reason. It is necessary for photodetecting elements to receive light from outside, and for display elements to be visible from outside. The two types of elements must, therefore, be formed in or adjacent outwardly exposed positions. If the multi-layer semiconductor device 10 shown in FIG. 24K is applied to the image processing system, since the display elements and photodetecting elements are formed on one side of the substrate, the substrate must be transparent and the display elements are formed closest to the substrate and the photodetecting elements remotest therefrom, or, conversely, the photodetecting elements are formed closest to the substrate and the display elements remotest therefrom. Since the previously formed active layers are heated every time a new active layer is formed, the active layer close to the substrate is heated more frequently than the active layer or layers farther away from the substrate. Thus, a material having a poor heat-resisting property cannot be used for the layer close to the substrate.

If, for example, a sensor comprising an amorphous material were formed in the layer close to the substrate, this sensor would be inoperable since the amorphous material would become crystallized as a result of the long heat treatment. If a sensor comprising a pn junction were formed in the layer close to the substrate, the position of junction in the pn junction would shift or would extend deep into the semiconductor layer as a result of the long heat treatment, thereby lowering the light absorption efficiency of the sensor. Further, a liquid crystal display formed adjacent the substrate would have the liquid crystal destroyed by the heat.

In order to avoid the above setbacks, a possible consideration is that, for example, an active layer including display elements is formed on one surface of the substrate, and an active layer including sensor elements is formed on the other surface thereof. However, this construction would require through holes to be formed in the thick substrate in order to electrically interconnect the active layers formed on the opposite surfaces of the substrate. Since it is difficult to form a plurality of through holes in the substrate, this method cannot be applied to the above system which requires a high degree of integration. Thus, it is very difficult to apply the multi-layer type semiconductor device with the SOI layers stacked only on one surface of the substrate to an image processing system having a photodetecting portion and a display portion formed on a single chip. Generally, therefore, as shown in FIG. 25, a photodetecting portion 20 and a display portion 30 are fabricated separately and are electrically interconnected through leads 15.

In FIG. 25, the photodetecting portion 20 includes a substrate 201, an insulating layer 202 formed on the substrate 201 for forming an SOI layer, a three-dimensional integrated circuit 215 formed on the insulating layer 202 and having a processing circuit for processing an electric signal based on the light received by the photodetecting portion 20 and a memory circuit for storing data for comparison with the electric signal, a photoelectric sensor 216 having a photodiodes arranged in matrix form, and an output circuit 217 having output pads. The three-dimensional integrated circuit 215 includes active layers L1, L2 ... Ln forming, individually or in combination, circuits having independent functions, and signals are communicated among the layers via through holes. The display portion 30 includes a substrate 301, a switching circuit 318 having electrodes for driving a liquid crystal display, an input circuit 317 having input pads, a liquid crystal 319, a resin member 320 for sealing the liquid crystal, and a window 321.

In the image processing system shown in FIG. 25, the photoelectric sensor 216 of the photodetecting portion 20 receives light traveling in the direction of arrow A from an object, and converts it into an electric signal. This electric signal is electrically processed by the three-dimensional integrated circuit 215 for contour extraction and highlighting, pattern recognition and the like. This electric signal is transferred from the output pads 217 of the output circuit such as a shift register through the leads 15 to the input pads 317 of the display portion 30. In the display portion 30, the liquid crystal 319 is driven in response to the signal transferred, to display a figure such as of contour lines. The displayed figure is visible through the window 321 in the direction of arrow B.

A method of manufacturing the photodetecting portion and display portion of the image processing system shown in FIG. 25 will be described in outline next.

Referring to FIG. 26A, the photodetecting portion is manufactured by forming the three-dimensional integrated circuit 215, which carries out image processing, on the insulating layer 202 superposed on the silicon substrate 201 in the same way as described with reference to FIGS. 24A through 24K. Referring next to FIG. 26B, the photoelectric sensor 216 and the output circuit 217 having the output pads are formed on the three-dimensional integrated circuit 215.

Referring to FIGS. 26C and 26D, the display portion is manufactured by forming, on the substrate 301, the switching circuit 318 having the electrodes for driving the liquid crystal display, and the input circuit 317 having the input pads. Then the resin member 320 for sealing the liquid crystal is mounted in position, and the transparent window 321 is attached to the resin member 320. Subsequently, pressure in a gap between the switching circuit 318 and window 321 is reduced to introduce the liquid crystal 319 therein.

A sensing system employing the foregoing multi-layer type semiconductor device having the three-dimensional integrated circuit will be described next. This sensing system includes a sensor provided at an input side for detecting light, pressure, temperature or radiation, and light emitting elements such as light emitting diodes at an output side for displaying sensing results. Such a sensing system is shown in FIG. 27.

In FIG. 27, a sensor portion 40 includes a substrate 401, an insulating an SOI layer, a three-dimensional integrated circuit 415 formed of a plurality of active layers L1, L2 ... Ln and having a processing circuit for processing information detected by the sensor portion 40, and an output circuit 417 having output pads. An output portion 50 includes a substrate 501, display elements 522 which are red, green and blue light emitting diodes arranged in matrix form, and an input circuit 517 having input pads.

This sensing system is manufactured by the following method. As shown in FIG. 28A, the insulating layer 402 is formed on the substrate 401, and the three-dimensional integrated circuit 415 is formed on the insulating layer 402. Then, as shown in FIG. 28B, the sensor 416 and the output circuit 417 having the output pads formed.

As shown in FIGS. 28C and 28D, the display elements 522 which are the light emitting diodes arranged in matrix form, and the input circuit 517 having the input pads are formed on the substrate 501. Next, the output pads 417 and input pads 517 are interconnected by leads 15. This completes the sensing system having a sensing function and a displaying function.

The foregoing image processing system or sensing system may be classified broadly into two types by a difference in displaying mode.

The first type, as shown in FIG. 29, has a photodetecting portion 20 and a display portion 30 formed of materials penetrable to light, and a transmitted image of an object 25 to be detected and an image based on results of processing are superimposed when seen by the naked eye 35. The transmitted image herein refers to an image of the object 25 visible through the photodetecting portion 20 and display portion 30, and the image based on results of processing refers to an image displayed on a liquid crystal 319. With this type of system, a precise positional adjustment between the photodetecting portion 20 and display portion 30 is necessary for the transmitted image and the image based on results of processing to be seen in perfect register.

In the second type, as shown in FIGS. 30 and 31, only the image displayed on the display portion 30 or 50 can be seen by the naked eye 35. This type of system provides no transmitted image of the object 25.

FIG. 30 shows a system employing the liquid crystal 319 as the display device, while FIG. 31 shows a system employing the light emitting element 522. Particularly where the signal processing function of the three-dimensional integrated circuit 215 or 415 is jeopardized by external light or light from the object 25, a light shielding film 224 or 424 is inserted between the sensor 216 or 416 and three-dimensional integrated circuit 215 or 415.

The second type of system using a liquid crystal as the display device may be further classified into the reflection type and the transmission type. As shown in FIG. 30, the reflection type includes a reflecting film provided on a rear surface of the liquid crystal 319 to give a display by light reflected from the reflecting film on the rear surface of the liquid crystal 319. As shown in FIG. 32, the transmission type includes a light source 323 disposed behind the liquid crystal 319 to give a display by transmitted light passing through the liquid crystal 319. The reflection type shown in FIG. 30 employs a material having high reflectance, such as a silicon substrate, as the substrate 301a of the display portion 30.

The transmission type shown in FIG. 32 employs a transparent substrate as the substrate 301b of the display portion 30, and includes a light emitter 323 outwardly of the transparent substrate 301b. However, in this case too, the light from the light emitter 323 will enter the three-dimensional integrated circuit 215 to jeopardize its signal processing function if a substrate 201b and an insulating layer 202b are penetrable to light. In order to avoid such trouble, it is necessary to provide a light shielding plate 324 between the light emitter 323 and photodetecting portion 20 as shown in FIG. 33, or to employ a light shielding material as the substrate 201c of the photodetecting portion 20.

Where the signal processing function of the three-dimensional integrated circuit 215 is jeopardized by external light or light from the object 25, a light shielding film 224 or 424 must be inserted between the sensor layer 216 and three-dimensional integrated circuit 215 as in the systems shown in FIGS. 30 and 31.

Further, where the foregoing liquid crystal display device is employed, there is a disadvantage of enlarging the system configuration since it is necessary to incorporate a light emitter.

The image processing system or sensing system employing the multi-layer type semiconductor device with active layers stacked only on one surface of a semiconductor substrate, as described above, has the sensor portion and display portion fabricated on separate chips, which results in the following disadvantage. There are a serial transmission system and a parallel transmission system for transferring signals between the two chips. A transfer of the signals in serial transmission is time-consuming and makes real-time processing impossible. A parallel transfer of the signals necessitates numerous input and output pads to be provided on each chip, which inevitably leads to an increased chip area.

The manner in which the input and output pads of the multi-layer type semiconductor device forming the background of this invention are arranged will be described next.

FIG. 34A is a plan view of the multi-layer type semiconductor device, FIG. 34B is a bottom view thereof, and FIG. 34C is a section taken on line 34C-34C of FIG. 34A. As shown in FIG. 34A through 34C, pads 617a and 617b are provided only on one side of the multi-layer type semiconductor device 60, with no pads provided on the other side.

As shown in FIG. 34C, a first active layer 615a is formed on a substrate 601a, and a second active layer 615b is formed on the first active layer 615a through an insulating layer 612. The first active layer 615a and second active layer 615b include electric circuits serving the purpose for which the semiconductor device 60 is intended. The electric circuit in the first active layer 615a and the electric circuit in the second active layer 615b are electrically interconnected by conductors mounted in through holes 614b. Refractory metal interconnections 611 are led out of the electric circuit formed in the first active layer 615a. Pads 617a are formed on the insulating layer 612, and aluminum interconnections 613a extend from the pads 617a. These interconnections 613a are electrically connected to the refractory metal interconnections 611 by conductors mounted in through holes 614a. Aluminum interconnections 613b are led out of the electric circuit formed in the second active layer 615b. These aluminum interconnections 613b are electrically connected to pads 617b formed on the insulating layer 612.

Of the pads arranged around the electric circuit 615b shown in FIG. 34A, the outer pads 617a correspond to the first active layer 615a and the inner pads 617b to the second active layer 615b. Pads 617b are used, for example, as input pads while pads 617a are used, for example, as output pads. In this case, signals input through the pads 617b are processed by the two-layer electric circuits 615b and 615a and output through pads 617a.

FIGS. 35A through 35E are sectional views illustrating a method of manufacturing the multi-layer type semiconductor device 60 shown in FIGS. 34A and 34C. The method of manufacturing the multi-layer type semiconductor device will be described next with reference to FIGS. 35A through 35E.

Referring to FIGS. 35A and 35B, the first active layer 615a is formed on the substrate 601a by the method shown in FIGS. 24A through 24G. The substrate comprises a semiconductor substrate or quartz. Next, an electric circuit comprising semiconductor elements if formed in the active layer 615a, and the refractory metal interconnections 611 are formed as electrically connected to the electric circuit.

Referring to FIG. 35C next, the insulating layer 612 is formed over an entire surface of the substrate 601a, which is then flattened.

Referring to FIG. 35D next, a substrate 601b having an epitaxial layer 604 formed on one side thereof is superposed on the insulating layer 612, and the substrate 601a and 601b are bonded together by annealing in an atmosphere of about 800° C. Thereafter, the substrate 601b is thinned down to expose the epitaxial layer 604 by the same method as described with reference to FIG. 24I.

Referring to FIG. 35E next, the second active layer 615b is formed on the epitaxial layer 604 acting as the base, an electric circuit comprising semiconductor elements if formed on the active layer 615b, and the electric circuits of the first and second active layers are interconnected via through holes 614b formed in the insulating layer 612. On the insulating layer 612 are formed the aluminum interconnections 613b electrically connected to the electric circuit of the second active layer, and the pads 617b electrically connected to the aluminum interconnections 613b. Further, on the insulating layer 612 are formed the pads 617a, and aluminum interconnections 613a electrically connected to the pads 617a and electrically connected via the through holes 614a to the interconnections 611.

As described above, the multi-layer type semiconductor device forming the background of this invention has the pads formed only on one surface of a chip. Thus, there is a problem of having to enlarge the chip area when providing a large number of pads.

The multi-layer type semiconductor device forming the background of this invention, because the SOI layers or active layers are stacked in a fixed direction, has various disadvantages as follows:

(1) Where a large number of layers are stacked, a distortion due to the stacking in a fixed direction, that is, stacking from only one side of the substrate becomes apparent, which results in fluctuations of a threshold voltage and an increase in leakage.

(2) A possible consideration is that, where necessary, SOI layers stacked in a fixed direction are formed on one surface of a substrate, and an active layer or layers are formed on the other surface thereof, the latter being electrically connected to the elements formed in the SOI layers. However, it is difficult to form a plurality of through holes in the thick substrate.

(3) In a system comprising a photodetecting portion or sensor portion and a display portion, the stacked SOI layers must include a sensor layer and a display layer located closest to and remotest from the substrate. It is, therefore, difficult to realize an image processing system or a sensing system formed on a single chip.

(4) That the sensor portion and display portion must be formed on separate chips entails the following disadvantages. It is difficult to transfer a large amount of data at high speed. A positional adjustment must be effected in order to place an object detected and an image displayed in register, Furthermore, the device per se has a large configuration.

(5) Since the input and output pads are formed only on one surface of the substrate, an increase in the number of input and output pads results in a large chip configuration.

SUMMARY OF THE INVENTION

An object of this invention is to eliminate the drawbacks due to the fixed stacking direction of the multi-layer type semiconductor device.

Another object of this invention is to provide a multi-layer type semiconductor device for use in image processing, which has a photodetecting portion and a display portion formed on a single chip.

Yet another object of this invention is to provide a multi-layer type semiconductor device suited for sensing purposes, which has a sensor portion and a display portion formed on a single chip.

A further object of this invention is to provide a multi-layer type semiconductor device having input and output pads formed on opposite surfaces of a chip.

A still further object of this invention is to provide a method of manufacturing a multi-layer type semiconductor device having a plurality of active layers stacked in opposite directions.

A still further object of this invention is to provide a method of manufacturing a multi-layer type semiconductor device for use in image processing, which has a photodetecting portion and a display portion formed on a single chip.

Another object of the invention is to provide a method of manufacturing a multi-layer type semiconductor device, wherein transparent layer of device is not exposed to repeatable heating and can be made clear.

A still further object of this invention is to provide a method of manufacturing a multi-layer type semiconductor device suited for sensing purposes, which has a sensor portion and a display portion formed on a single chip.

A still further object of this invention is to provide a method of manufacturing a multi-layer type semiconductor device having input and output pads formed on opposite surfaces of a chip.

According to this invention, a multi-layer type semiconductor device comprises a substrate having a main surface, a first semiconductor element layer formed on the main surface of the substrate and including semiconductor elements, an insulating layer formed on the first semiconductor element layer, and a second semiconductor element layer formed on the insulating layer and including semiconductor elements arranged in vertically back-to-back relations with the semiconductor elements of the first semiconductor element layer.

Through holes may be defined between the first semiconductor element and the second semiconductor element layer for electrically interconnecting the elements.

In another aspect of this invention, a multi-layer type semiconductor device comprises a transparent substrate, a photosensor layer including photosensor elements for detecting light passing through the transparent substrate and converting the light into an electric signal, a circuit layer for processing the electric signal received from the photosensor layer, an insulating layer formed on the circuit layer, and a display element layer formed on the insulating layer and including display elements arranged in vertically back-to-back relations with the photosensor elements of the photosensor layer and electrically connected to the circuit layer.

In a further aspect of this invention, a multi-layer type semiconductor device comprises a transparent substrate, a display element layer including display elements and formed on the transparent substrate such that a display given by the display elements is visible through the transparent substrate, a circuit layer including a processing circuit for processing a display to be given by the display elements, an insulating layer formed on the circuit layer, and a sensor layer formed on the insulating layer and including sensor elements arranged in vertically back-to-back relations with the display elements of the display element layer.

In a still further aspect of this invention, a multi-layer type semiconductor device comprises a substrate defining perforations and having conductors formed in the perforations, a first circuit layer formed on the substrate and including an electric circuit electrically connected to the conductors, an insulating layer formed on the first circuit layer and defining through holes, a second circuit layer formed on the insulating layer and including an electric circuit arranged in vertically back-to-back relations with the electric circuit of the first circuit layer and electrically connected to the electric circuit of the first circuit layer via the through holes, and pads electrically connected to the electric circuit of the second circuit layer.

According to this invention, a method of manufacturing a multi-layer type semiconductor device comprises the steps of forming a base member by successively stacking, on a main surface of a first substrate, a first semiconductor layer, an insulating layer and a second semiconductor layer, forming a semiconductor device by using the second semiconductor layer as a base with the exposed surface of the second semiconductor layer directed upward, forming an insulating film on the semiconductor device, attaching a second substrate to the insulating film, thinning the first substrate to expose the first semiconductor layer, and forming a further semiconductor device by using the first semiconductor layer as a base with a exposed surface of the first semiconductor layer directed upward.

In a different aspect of this invention, a method of manufacturing a multi-layer type semiconductor device comprises the steps of forming perforations through a first substrate, filling the perforations with conductors, successively forming, on a main surface of a second substrate, a first semiconductor layer, an insulating layer on the first semiconductor layer, and a second semiconductor on the insulating layer, forming a first electric circuit by using the second semiconductor layer as a base, and first pads electrically connected to the first electric circuit, bonding the first substrate and the second substrate so as to electrically interconnected the conductors of the first substrate and the first pads of the second substrate, thinning the second substrate to expose the first semiconductor layer, and forming a second electric circuit by using the first semiconductor layer as a base, and second pads electrically connected to the second electric circuit.

The multi-layer type semiconductor device is obtained by forming a first semiconductor layer, an insulating layer and a second semiconductor layer in the mentioned order on a main surface of a first substrate, forming a semiconductor device by using the second semiconductor layer as a base, with an exposed surface thereof directed upward, forming an insulating film on the semiconductor device, attaching a second substrate to the insulating film, thinning the first substrate to expose the first semiconductor layer, and forming a further semiconductor device by using the first semiconductor layer as a base, with an exposed surface of the first semiconductor layer directed upward.

A plurality of semiconductor element layers are not stacked in one direction but stacked in vertically opposite directions, and therefore little distortion results from a multi-layer structure. Consequently, there occurs no variation in the threshold current or an increase in leakage with a multi-layer semiconductor device. Since semiconductor element layers are formed on opposite surfaces of an insulating layer, the semiconductor layers formed at opposite ends undergo heat treatments with a reduced frequency. This allows an image processing system or a sensing system having sensor elements, display elements or the like which are vulnerable to heat to be integrated on a single chip. Compactness of such a system is promoted since it can be formed on a single chip. Moreover, since a sensor can be exposed, a single-chip type sensing system may be obtained which is capable of detecting temperature, pressure or radiation, let alone light.

The respective semiconductor layers are interconnected via through holes to be capable of communicating signals without a short time. Numerous signals may be processed at high speed where signals are transferred in a parallel mode.

An increased number of signal outlets (pads) may be formed since both surfaces of a chip are used for forming such.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 2A through 2F are sectional views showing a method of manufacturing a single-chip type image processing system embodying this invention.

FIG. 3 is a view showing a signal transfer mode in the image processing system shown in FIG. 2F.

FIGS. 16, 17A, 17B, 18 and 19 are views showing a modification of the single-chip type image processing system embodying this invention.

FIGS. 22A through 22C are views showing a pad arrangement in a multi-layer type semiconductor device embodying this invention.

FIGS. 24A through 24K are sectional views showing a method of manufacturing a multi-layer type semiconductor device forming the background of this invention.

FIG. 25 is a view showing an image processing system employing the multi-layer type semiconductor device forming the background of this invention.

FIGS. 26A through 26D are views showing a method of manufactured the image processing system shown in FIG. 25.

DESCRIPTION OF THE PREFERRED EMBODIMENTS

Figure 1I:
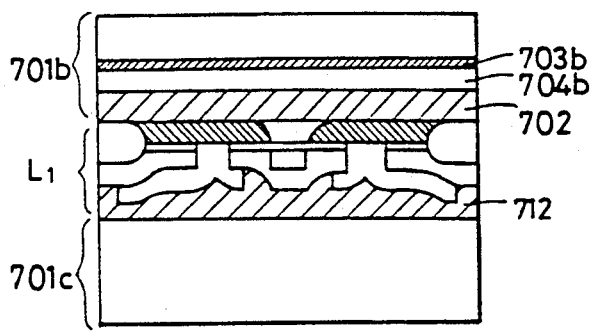
FIGS. 1A through 1N are sectional views showing a method of manufacturing a multi-layer type semiconductor device in one embodiment of this invention.
Figure 1L:
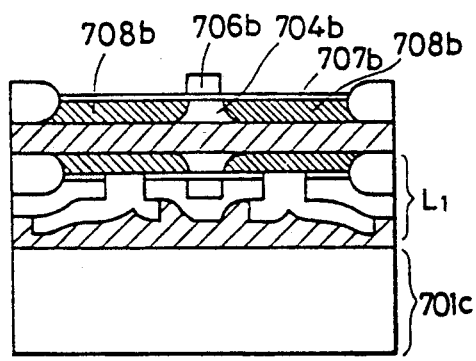
Figure 1J:
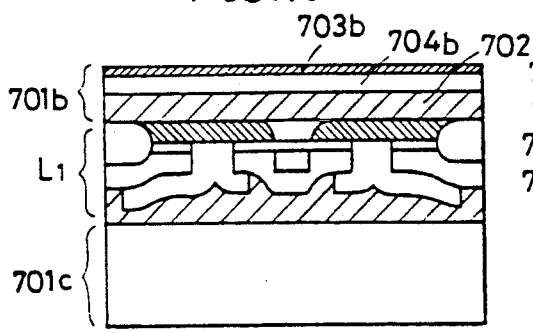
Figure 1M:
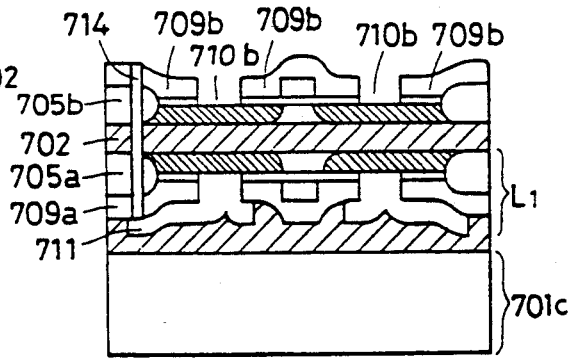
Figure 1K:
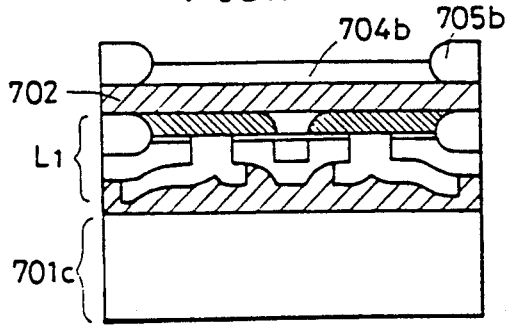
Figure 1N:
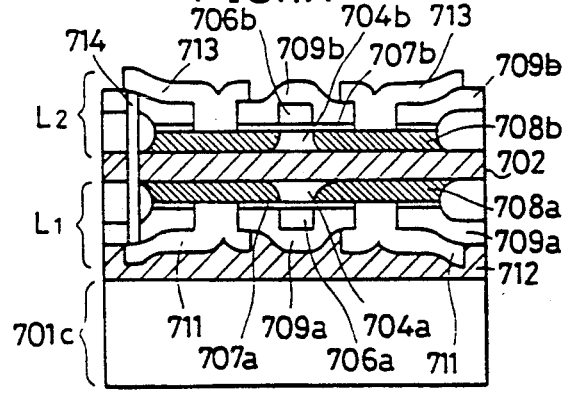

FIGS. 1N shows a multi-layer type semiconductor device according to this invention. Referring to FIG. 1N, the multi-layer type semiconductor device comprises a substrate 701c, two active layers L1 and L2 formed to be disposed in vertically back to back relation on the substrate 701c, and an insulating layer 702 for electrically insulating the two active layers. The lower active layer L1 comprises source and drain regions 708a formed in an epitaxial layer 704a, a gate insulator film 707a, a gate electrode 706a, an interlayer insulating film 709a, refractory metal interconnections 711, and an insulating layer 712. The upper active layer L2 comprises source and drain regions 708b formed in an epitaxial layer 704b, a gate insulator film 707b, a gate electrode 706b, an interlayer insulating film 709b, and interconnections 713 made of aluminum or aluminum alloy. The active layers L1 and L2 can be electrically connected through conductors formed in through holes 714.

A method of manufacturing a multi-layer type semiconductor device according to this invention will be described with reference to FIGS. 1A through 1N.

Referring first to FIG. 1A, a first silicon wafer 701a having a thickness of 500 to 600 μm includes, on a surface region thereof, a boron-injected layer 703a with boron injected thereinto in a high concentration on the order of $1 \times 10^{20}/cm^3$, and a low concentration epitaxial layer 704a formed by epitaxy to have a thickness of about 5,000Å.

A second silicon wafer 701b, having a thickness corresponding to that of the first silicon wafer 701a includes, on a surface region thereof, a boron-injected layer 703b with boron injected thereinto in a high concentration on the order of $1 \times 10^{20}/cm^3$, a low concentration epitaxial layer 704b having a thickness of about 5,000Å, and an insulating layer 702 formed 1,000 to 10,000Å thick by thermal oxidation. The epitaxial layers 704a and 704b are obtained by causing silicon crystals to grow epitaxially on single-crystal silicone substrates 701a and 701b, and have a uniform crystalline property, respectively.

Referring to FIG. 1B, the two wafers are placed in superposition with the insulating layer 702 of the wafer 701b and the epitaxial layer 704a of the wafer 701a opposed to each other, and are subjected to electrostatic attraction in a conventional manner, and are heated-treated (annealed) in an atmosphere of about 800° C. for 5 hours. The annealing induces an interatomic junction over contacting surfaces, which bonds the two wafers 701a and 701b together. Next, the wafer 701a is polished or etched with a mixed liquid of hydrofluoric acid and nitric acid or with an aqueous solution of potassium hydroxide until its thickness is reduced to 10 μm. Next, the wafer 701a is etched with an aqueous solution of ethylenediamine and pyrocatechol. The etching step using this aqueous solution is carried out at a rate of 1 μm/min. for semiconductor regions having a low concentration of boron, whereas the etching progresses at a rate of 20Å/min. for regions of higher boron concentration. Consequently, as shown in FIG. 1C, the etching action virtually stops at the high concentration boron-injected layer 703a.

Next, the high concentration boron-injected layer 703a is removed by RIE (Reactive Ion Etching). this results in a structure including the epitaxial layers 704a and 704b contacting an upper surface and a lower surface of the insulating layer 702 on the substrate 700 as shown in FIG. 1C. As will be described later, active layers are formed on the epitaxial layers 704a and 704b in vertically opposite directions. While, in the drawings, the insulating layer 702, high concentration boron-injected layers 703a and 703b, and epitaxial layers 704a and 704b are illustrated as if having a combined thickness exceeding that of the substrate 700, it should be noted that the insulating layer 702, high concentration boron-injected layers 703a and 703b, and epitaxial layers 702a and 704b are extremely thin compared with the thickness of the substrate 700.

Next, the exposed surface is oxidized, and then an oxide film is etched away. This leaves a thin SOI layer 704a having a thickness of the order of 1,000Å.

Referring to FIG. 1D next, field oxide layers 705a are formed by LOCOS in regions of the SOI layer 704a which re to serve as isolation regions.

Referring to FIG. 1E next, a gate insulator film 707a is formed by oxidation of the SOI layer 704a, and a polysilicon layer is formed on the gate insulator film 707a. This polysilicon layer is patterned into a shape of a gate electrode 706a. Next, impurities are applied by ion implantation using the gate electrode 706a as a mask to form source and drain regions 708a.

Referring to FIG. 1F next, an interlayer insulating film 709a is formed over the entire surface, and contact holes 710a, are formed through the interlayer insulating film 709a.

Referring to FIG. 1G next, refractory metal interconnections 711 are formed as electrically connected to the source and drain regions 708a and extending onto the interlayer insulating films 709a. The gate electrode 706a, gate insulator film 707a and source and drain regions 708a constitute a transistor. A first active layer L1 is obtained in this way. Next, a insulating layer 712 is formed over the interlayer insulating film 709a and refractory metal interconnections 711.

Referring to FIG. 1H next, the insulating layer 712 is flattened by conventional reaction ion etching for the purpose of superposition. Thereafter the flattened insulating layer 712 is superposed by a third silicon wafer 701c having a thickness of 500 to 600 μm. The integrated wafers and the wafer 701c are heat-treated (annealed) in an atmosphere of about 800° C. for 5 hours, thereby to become bonded together.

Next, as shown in FIG. 1I, the bonded wafers are turned over and the upper surface of the wafer 701b is thinned by polishing and/or by etching with the mixed liquid of hydrofluoric acid and nitric acid. Further, the wafer 701b is etched with the aqueous solution of ethylenediamine and pyrocatechol. Consequently, as shown in FIG. 1J, the wafer 701h is removed except the high concentration boron-injected layer 703b and epitaxial layer 704b. Subsequently, to form semiconductor elements, the boron-injected layer 703b is etched away. Next, the exposed surface is oxidized, and then an oxide film is etched away. This results in a thin SOI layer 704b on the order of 1,000Å. There occurs no concentration of forces acting on the active layer L1 when the wafer 701b is thinned, because the active layer L1 is supported by the thick and hard substrate 701c.

Referring to FIG. 1K next, field oxide layers 705b are formed by LOCOS in regions of the SOI layer 704b which are to serve as isolation regions.

Referring to FIG. 1L next, a gate insulator film 707b is formed by oxidation of the SOI layer 704b, and a polysilicon layer is formed on the gate insulator film 707b. This polysilicon layer is patterned into a shape of a gate electrode 706b. Next, impurities are applied by ion implantation using the gate electrode 706b as a mask to form source and drain regions 708b. The gate electrode 706b, gate insulator film 707b and source and drain regions 708b constitute a transistor.

Referring to FIG. 1M next, an interlayer insulating film 709b is formed over the entire surface, and contact holes 710b are formed through the interlayer insulating film 709b. Through holes 714 are formed, as necessary, to extend through the field oxide layers 705b, insulating layer 702, field oxide layers 705a and interlayer insulating film 709a to the refractory metal interconnections 711, for forming therein conductors comprising tungsten or the like. In FIG. 1M, though through holes 714 are illustrated the same as the substrate 701c in thickness and length, it is noted that the actual length of the through holes is extremely short compared with the thickness of the substrate 701C. In order to electrically connect the active layers L1 and L2, many through holes can be provided.

Referring to FIG. 1N next, interconnections 713 comprising aluminum or an aluminum alloy are formed as electrically connected to the source and drain regions 708b and extending onto the interlayer insulating films 709b. These interconnections 713 are electrically connected to the refractory metal interconnections 711 via the conductors formed in the through holes 714. In this way, the first active layer L1 is formed on the back surface of the insulating layer 702, and the second active layer L2 on the front surface thereof. The active layer L1 is formed in the direction vertically opposite to the direction in which the second active layer L2 is formed.

In this embodiment, the third wafer comprises a substrate including no epitaxial layer or boron-injected layer. However, where a third active layer is to be formed, a substrate having an epitaxial layer and a boron-injected layer formed on a surface region thereof is used as the third wafer.

Although the foregoing embodiment has been described as having two active layers, any number of active layers may be stacked by repeating the wafer bonding step, thinning step, element forming step, and insulating layer forming step. Active layers other than the first active layer L1 and second active layer L2 may be stacked in the same direction as the first active layer L1 or in the same direction as the second active layer L2.

In the foregoing embodiment, as described above, the active layers are formed in vertically opposite directions with the insulating layer in between. This construction reduces, through mutual cancellation, distortions each resulting from the stacking in one direction. Further, signals are transferred between the active layers by way of the through holes, which allows signal communications to be effected within a short time.

A single-chip type image processing system embodying this invention will be described next with reference to FIGS. 2A through 2F. This system comprises a photodetecting portion and a signal processing portion formed monolithically within a single chip.

Referring to FIG. 2A, an insulating layer 802 having a thickness of 1,000 to 10,000Å is formed at a semiconductor substrate 800 having a thickness of 500 to 600 μm. On an upper and a lower surfaces of the insulating layer 802 are low concentration epitaxial layers 804a and 804b having an impurity concentration not exceeding $1 \times 10^{19}/cm^3$. Each epitaxial layer 804a or 804b has a thickness on the order of 5,000Å. The substrate 800 comprises a silicon substrate, for example. Between the epitaxial layer 804b and substrate 800 is a high concentration impurity-doped layer 803 having an impurity concentration of at least $1 \times 10^{19} cm^3$. As will be described later, active layers are formed in the epitaxial layers 804a and 804b in vertically opposite directions. The structure shown in FIG. 2A is obtained by bonding, by the method shown in FIGS. 1A through 1C, a first wafer 801a having the insulating layer 802, epitaxial layer 804b and high concentration impurity-doped layer 803, and a second wafer having the epitaxial layer 804a and a high concentration impurity-doped layer, and thinning the second wafer.

Referring to FIG. 2B, a signal processing circuit 815 is formed on the insulating layer 802, using the epitaxial layer 804a as a base. The signal processing circuit 815 may comprise a two-dimensional integrated circuit, but preferably is a three-dimensional integrated circuit including active layers L1, L2, ... Ln. The three-dimensional integrated circuit may be formed by the method described in the Background Art hereinbefore, or by the method described with reference to FIGS. 1A through 1N. This signal processing circuit 815 is intended for processing an image signal obtained by a photosensor described later.

It is to be noted that the signal processing circuit 815, insulating layer 802, epitaxial layer 804b and high concentration impurity-doped layer 803 have a very small thickness compared with that of the substrate 800.

Referring to FIG. 2C, a photosensor layer 816 having pixels arranged in matrix form is formed on the active layer Ln of the signal processing circuit 815. The photosensor layer 816 and signal processing circuit 815 are electrically interconnected.

Next, an insulating layer 812 is formed on the photosensor layer 816, and an upper surface of the insulating layer 812 is flattened. Then, a transparent substrate 801b is superposed on the flattened insulating layer 812. The substrate 801b and insulating layer 812 are bonded together, as shown in FIG. 2D, through a heat-treatment (annealing) in an atmosphere of about 800° C. The structure 79 thus obtained is turned over, and the upper surface 79 thus obtained is turned over, and the upper surface of the wafer 801a is thinned by polishing and/or etching with the mixed liquid of hydrofluoric acid and nitric acid. The wafer 801a is further etched with the aqueous solution of ethylenediamine and pyrocatechol, whereby the wafer 801a is removed, leaving the insulating layer 802, high concentration impurity-doped layer 803 and epitaxial layer 804b. That is, the substrate 800 shown in FIG. 2A is removed. During the tinning of the wafer 801a, the substrate 801b acts to prevent a concentration of forces from being applied to the three-dimensional integrated circuit 815 and photosensor layer 816 which are thin and weak.

Now, referring to FIG. 2E, the high concentration impurity layer 803 is removed by ion etching process. As a result, an epitaxial layer 804b with the rough surface is exposed. Next, the exposed surface is oxidized thereby forming an oxide film in a part of the epitaxial layer 804b. Then, the oxide film is removed by wet etching process. Consequently, the epitaxial layer 804b with the smooth surface is obtained. Thus, on the insulating layer 802, a thin SOI layer 804b is obtained, which is formed of an epitaxial layer and about 1000Å in thickness.

Referring to FIG. 2F next, a switching circuit 818 having electrodes for driving a liquid crystal display is formed, with the SOI layer 804b facing upward and acting as a base. The switching circuit 818 and signal processing circuit 815 are electrically interconnected via through holes 814. Through holes 814 are made in the same manner as the through holes shown in FIG. 1M. Next, a resin member 820 for sealing liquid crystal is mounted in position, and a transparent window 821 is attached to the resin member 820. Subsequently, pressure in a gap between the switching circuit 818 and window 821 is reduced to introduce liquid crystal 819 therein.

In this way, a system for electrically processing an image signal received by a photosensor and displaying results of the processing on a liquid crystal display is fabricated on a single chip. In the image processing system 80 shown in FIG. 2F, the photosensor 816 receives light traveling in the direction of arrow D, and converts it into an electric signal. This signal is processed by the three-dimensional integrated circuit 815, and the switching circuit 818 drives the liquid crystal display 819 to give a display. What is displayed may be seen in the direction E through the transparent window 821.

In the image processing system 80, the photosensor layer 816 and switching circuit 881 for display are stacked in vertically opposite directions. That is, the photosensor layer 816 is formed when the direction of arrow F is upward while the switching circuit 818 is formed when the direction of arrow G is upward. Signal transfer efficiency is extremely high since there is only a microscope spacing between the photosensor layer 816 and switching circuit 818, and since signals are transferred from the photosensor layer 816 and signal processing circuit 815 to the switching circuit 818 via the through holes 814. Further, the signal transfer may be effected in a minimal time by a parallel, concurrent mode using numerous through holes 814 as shown in FIG. 3.

Figure 4A:
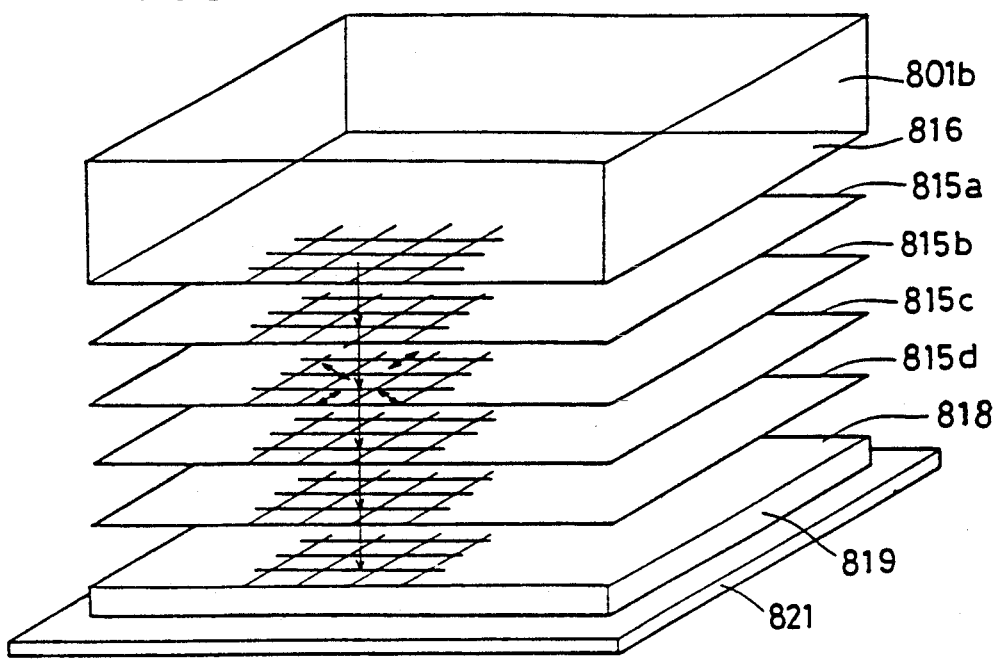
FIGS. 4A and 4B are views showing the operating principle of the image processing system embodying this invention.
Figure 4B:
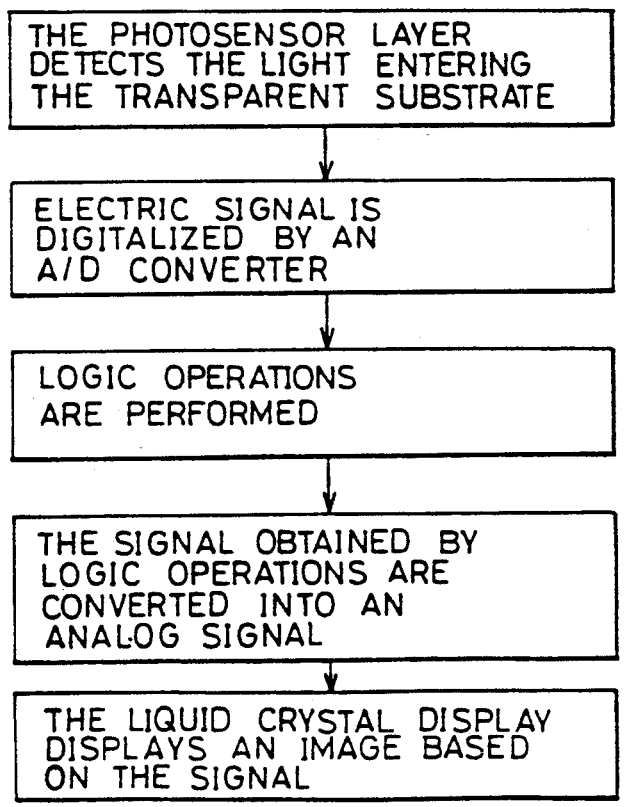

The operating principle of the above image processing system will be described next with reference to FIGS. 4A and 4B. The light entering the transparent substrate 801b is detected and converted into an electric signal by the photosensor layer 816. This electric signal is digitalized by an analog-to-digital converter 815a, which is put to logic operations at logic circuit layers 815b, and 815c. The logic operations will be described later. After the logic operations, the signal is converted into an analog signal by a digital-to-analog converter 815d and applied to the switching circuit 818. The switching circuit 818 drives the liquid crystal display 819 to display an image.

Specific examples of the logic circuit layers 815b and 815c will be described next.

Figure 5:
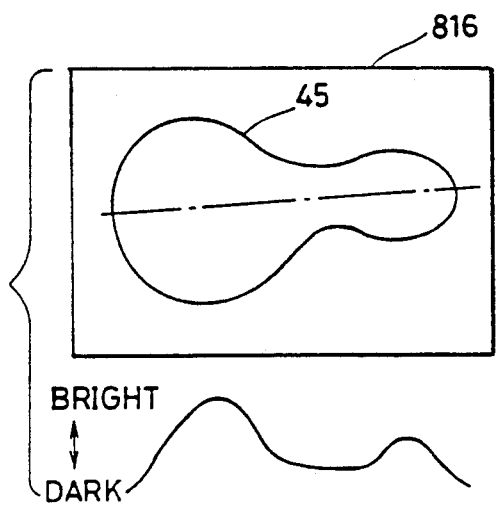
FIG. 5 is a view showing an optical image projected to a photosensor layer shown in FIG. 4A.
Figure 6:
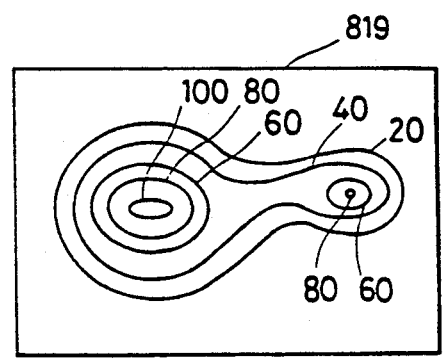
FIG. 6 is a view of contour lines displayed on a liquid crystal display based on the optical image shown in FIG. 5.

A logic circuit used for representing lightness of an optical image in contour lines will be described as a first example. It is assumed here that an optical image 45 as shown in FIG. 5 is projected to the photosensor layer 816. FIG. 5 also shows lightness along the centerline (in a dot and dash line) of the optical image 45. FIG. 6 shows a figure of contour lines displayed on the liquid crystal display 819, which correspond to the optical image 45. Display may be made, along with the contour lines, of position coordinates of a pixel having a maximum brightness, position coordinate of a pixel having a minimum brightness, a mean value of the brightness and deviations therefrom.

Contour lines representing brightness of 20, 40, 60, 80 and 100 may be obtained by employing a logic circuit that outputs a match signal "1" when an output "a" of the analog-to-digital convertor layer 815a agrees with a predetermined value "b" (b=20, 40, 60, 80 to 100).

For the match signal "1" to be output only when a=b, a and b be expressed in binary numerals as in the following equations:

$$a = \sum_{i=0}^{n-1} a_i \times 2^i \quad (1)$$

$$b = \sum_{i=0}^{n-1} b_i \times 2^i \quad (2)$$

Figure 7:
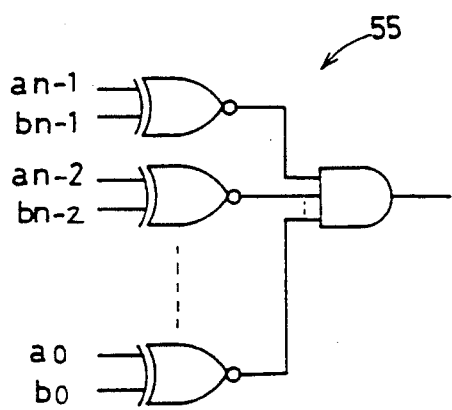
FIG. 7 is a view showing an equivalent circuit of one example of logic circuits shown in FIGS. 4A and 4B.

Then, the match signal "1" is output on the condition that $a_i$ and $b_i$ in the respective bits are in agreement. Therefore, a logic ($a_{n-1}$ XNOR $b_{n-1}$) AND ($a_{n-2}$ XNOR $b_{n-2}$) AND ... AND ($a_0$ XNOR $b_0$) may be adopted. Such a logic may be realized by a circuit 55 shown in FIG. 7.

Next, a logic circuit for extracting the brightest pixel from the photosensor 816 having pixels arranged in matrix form will be described as a second example.

Broadly, this logic circuit extracts the brightest pixel by comparing values of the respective bits, wherein the brightness of the pixels is represented by binary numerals.

Figure 8A:
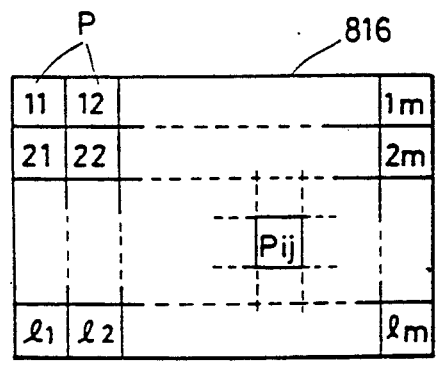
FIG. 8A is a view showing an arrangement of pixels in the photosensor layer shown in FIG. 4A.
Figure 8B:
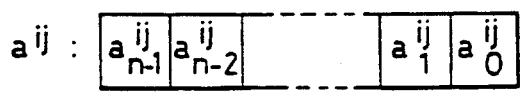
FIG. 8B is a graphic representation of data indicating brightness of the pixels shown in FIG. 8A.

Referring to FIG. 8A, the photosensor layer 816 includes pixels P arranged in l rows × m colums, and the pixel in the ith row and jth column in expressed by $p^{ij}$, Output of pixel $P^{ij}$ is digitalized by the analog-to-digital converter layer 815a. As shown in FIG. 8B its output $a^{ij}$ is expressed by binary numerals $a^{ij}_{n-1}, a^{ij}_{n-2} \ldots a^{ij}_1$ and $a^{ij}_0$.

The value $a^{ij}_{n-1}$ of the highest order bit of output $a^{ij}$ (i=1...l, j=1...m) is put to an OR operation for all the pixels, which provides $A_{n-1}$. Then;

$$A_{n-1} = (a^{11}_{n-1} \text{ OR } a^{21}_{n-1} \text{ OR } \ldots \text{ OR } a^{ij}_{n-1} \text{ OR } \ldots \text{ OR } a^{lm}_{n-1}) \quad (3)$$

Output $A_{n-1}$ is "0" when the values $a^{ij}_{n-1}$ are "0" for all the pixels, and is "1" when at least one of the values $a^{ij}_{n-1}$ is "1".

An XNOR operation of output $A_{n-1}$ and the values $a^{ij}_{n-1}$ of the respective pixels provides $B^{ij}n-1$. Then:

$$B^{ij}_{n-1} = (A_{n-1} \text{ XNOR } a^{ij}_{n-1}) \quad (4)$$

Output $B_{n-1}$ is "1" for all the pixels when the values $a^{ij}_{n-1}$ are "0" for all the pixels, and is "1" for at least one pixel when the value $a^{ij}_{n-1}$ is "1" for at least one pixel. The former means that all the pixels are in order for extraction, while the latter means that the one pixel should remain as a pixel eligible for extraction. In other words, output $B^{ij}_{n-1}$ is used as a criterion for determining which pixel or pixels should be extracted.

Next, only the pixels rendering output $B^{ij}_{n-1}$ "1" are retained as candidates, and an OR operation of the second highest order bit $a^{ij}_{n-2}$ is carried out for these pixels, which provides $A_{n-2}$. Then;

$$A_{n-2} = (a^{11}_{n-2} \text{ OR } a^{21}_{n-2} \text{ OR } \ldots \text{ OR } a^{ij}_{n-2} \text{ OR } \ldots \text{ OR } a^{lm}_{n-2}) \quad (5)$$

Next, an XNOR operation of output $A_{n-2}$ and the values $a^{ij}_{n-2}$ for the respective candidate pixels is carried out, which provides $B^{ij}_{n-2}$. Then;

$$B^{ij}_{n-2} = (A_{n-2} \text{ XNOR } a^{ij}_{n-2}) \quad (6)$$

Next, only the pixels rendering output $B^{ij}_{n-2}$ "1" are retained as candidates, and an OR operation of the next higher order bit $a^{ij}_{n-3}$ is carried out for these pixels, which provides $A_{n-3}$.

Further, an XNOR operation of output $A_{n-3}$ and the values $a^{ij}_{n-3}$ of the respective candidate pixels is carried out, which provides $B^{ij}_{n-3}$.

Subsequently, the candidates are narrowed down in a similar way, and finally pixel $ij$ making $B^{ij}_0 = 1$ is selected for extraction.

In this way, the brightest pixel is extracted. The darkest pixel is extractable by using a logic reversed from the above logic. The mean value and average of brightness may be obtained by employing an adder, a multiplier, a counter, a divider and the like as logic circuits.

Figure 9:
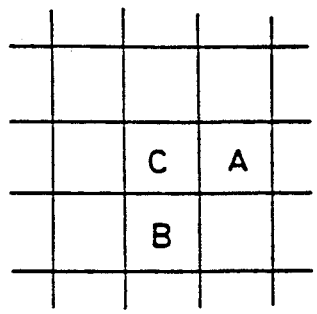
FIG. 9 is a view showing another example of pixel arrangement embodying this invention.
Figure 10:
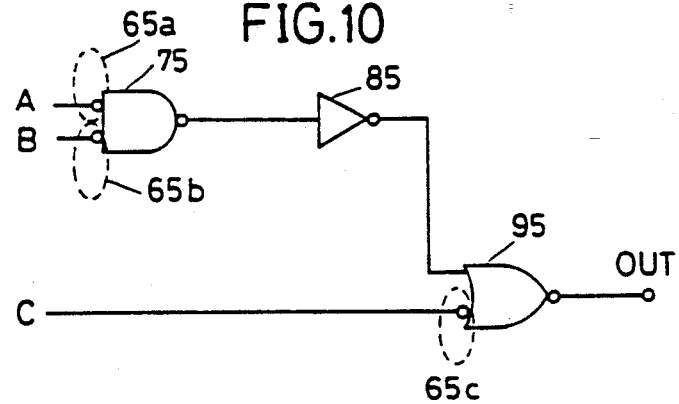
FIG. 10 is a view showing a circuit for modifying a signal of pixel C in the pixel arrangement shown in FIG. 9.

A logic circuit having a function for removing optical noise impinging on the pixels will be described next as a third example. For simplicity of description, a circuit is assumed here that modifies a signal from a pixel C in FIG. 9 and outputs "0" when adjacent pixels A and B output signals "0". Such a noise removing logic circuit is obtained, as shown in FIG. 10, by detection circuits 65a, 65b and 65c for detecting outputs of diodes of pixels A, B and C, a NAND gate 75, an inverter 85 and a NOR gate 95.

Figure 11:
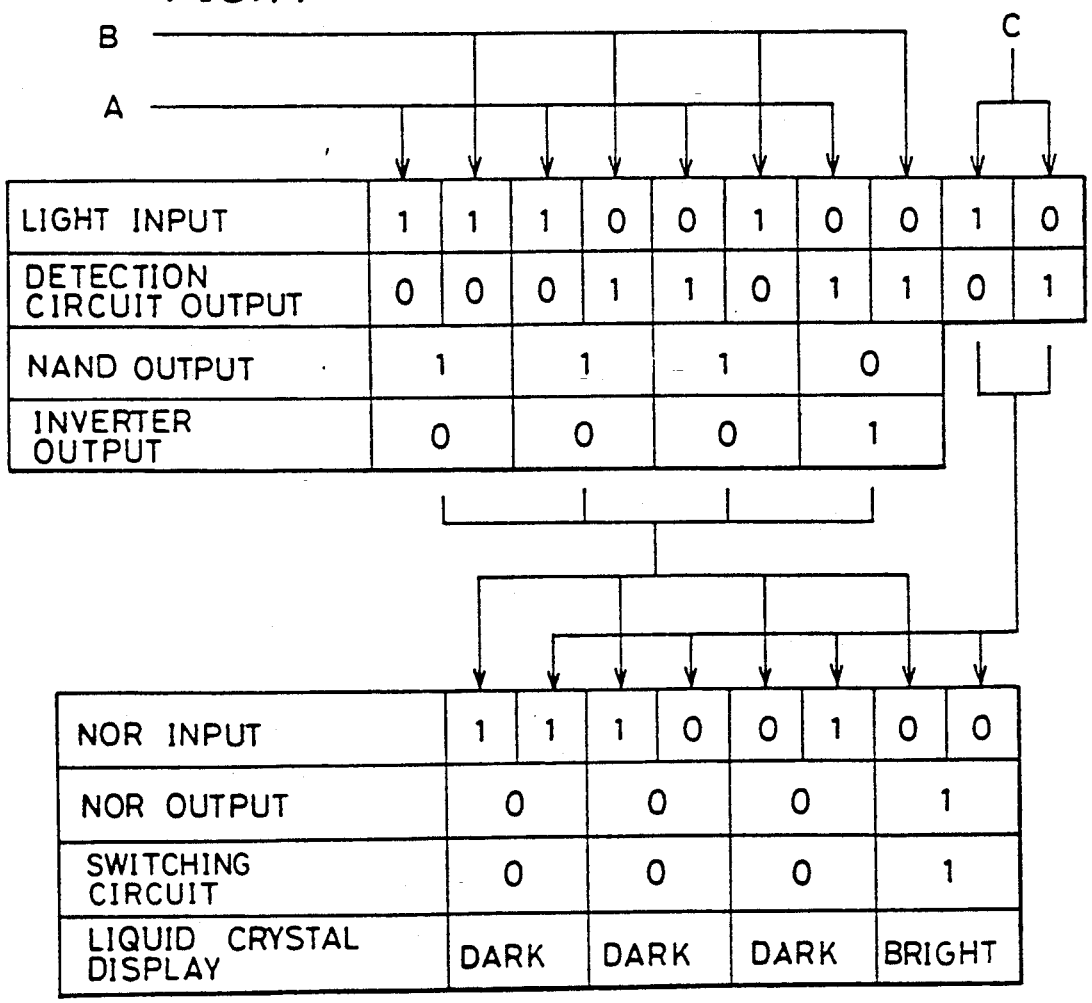
FIG. 11 is a view showing operation of the circuit shown in FIG. 10.

The manner in which the logic circuit shown in FIG. 10 operates will be described next with reference to FIG. 11.

When light inputs to pixels A, B and C are "1", that is when the respective pixels receive light exceeding a predetermined level, the corresponding detection circuits output signals "0". When light inputs are "0", the corresponding detection circuits output signals "1". NAND gate 75 outputs "0" only when both detection circuits 65a and 65b connected to pixels A and B, respectively, output "1", and otherwise outputs "1".

The output of NAND gate 75 is applied through the inverter 85 to one input terminal of NOR gate 95. The other input terminal of NOR gate 95 receives output of the detection circuit 65c connected to pixel C. NOR gate 95 outputs "1" only when the inverter 85 outputs "0" and the detection circuits 65c connected to pixel C outputs "0", and otherwise outputs "0". The output of NOR gate 95 is applied to a transistor in the switching circuit having the liquid crystal driving electrodes. The liquid crystal turns bright when this transistor is conductive or "1", and dark when the transistor is nonconductive. When light inputs to pixels A and B are "0", NAND gate 75 outputs "0". Since the inverter 85 outputs "1" as a result, NOR gate 95 receives "1" at the one input terminal. In this case, when light input to pixel C is "1", NOR gate 95 receives "0" at the other input terminal and, therefore, NOR gate 95 outputs "0". Thus, when light inputs to pixels A and B are "0", light input "1" to pixel C is modified to "0".

Figure 12:
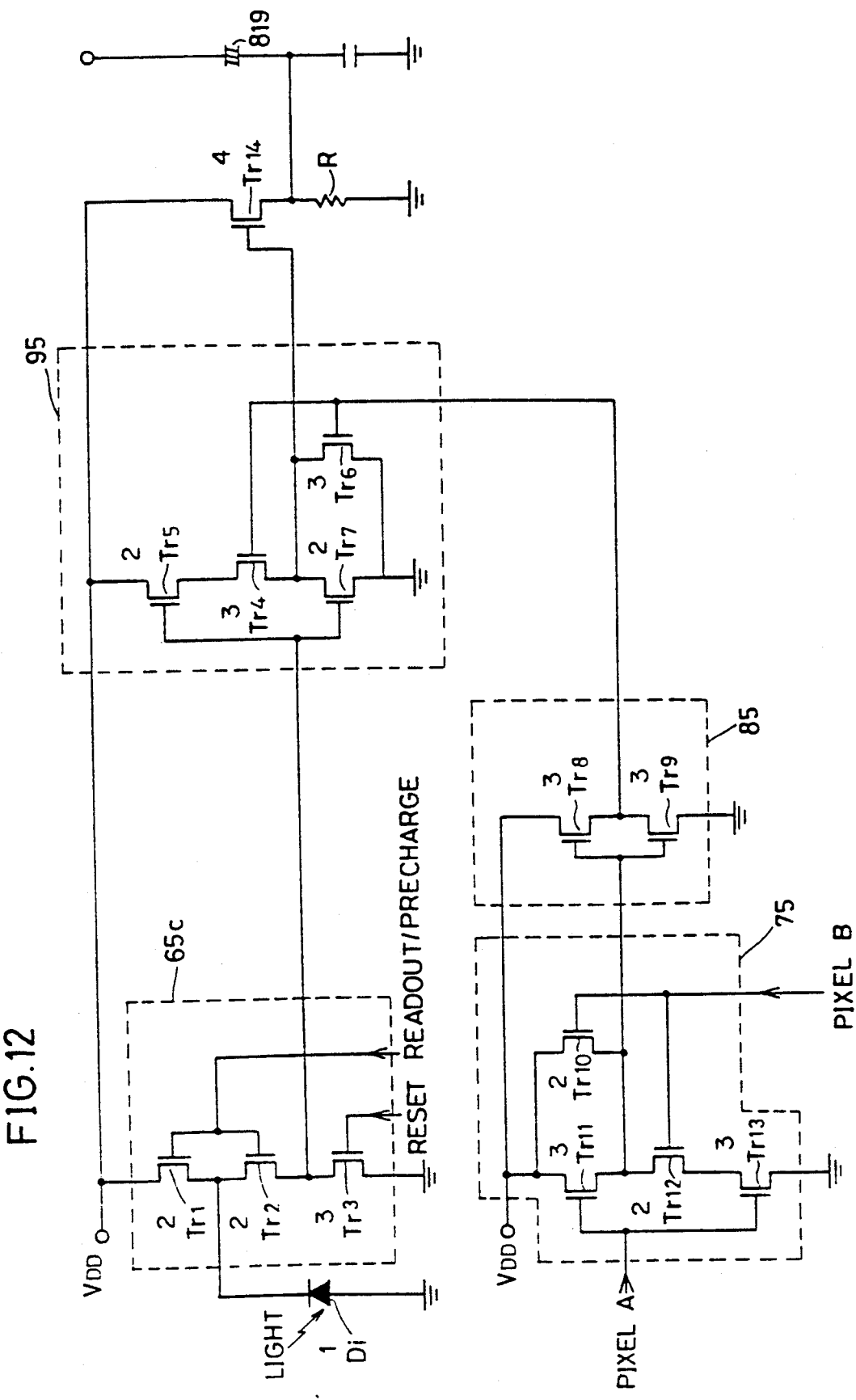
FIG. 12 is a view showing an equivalent circuit of a logic circuit having a noise removing function shown in FIG. 10.

FIG. 12 shows an equivalent circuit of the logic circuit having the holes removing function shown in FIG. 10. In FIG. 12, a p-channel MOSFET Tr1, an n-channel MOSFET TR2 and an n-channel MOSFET TR3 constitute the detection circuit 65c for detecting the output of a photodiode Di of pixel C. Readout/precharge pulses are applied to the gate electrodes of MOSFET Tr1 and MOSFET Tr2, while reset pulses are applied to the gate electrode of MOSFET Tr3. The output of the photodiode Di of pixel C is applied through the detection circuit 65c to the gate electrodes of a p-channel MOSFET Tr5 and an n-channel MOSFET Tr7 of NOR gate 95.

The output of the detection circuit 65a which detects the output of a photodiode of pixel A is applied to the gate electrodes of a p-channel MOSFET Tr11 and an n-channel MOSFET Tr13 of NAND gate 75. The output of the detection circuit 65b which detects the output of a photodiode of pixel B is applied to the gate electrodes of a p-channel MOSFET Tr10 and an n-channel MOSFET Tr12 of NAND gate 75.

The output of NAND gate 75 is applied to the gate electrodes of a p-channel MOSFET Tr8 and an n-channel MOSFET Tr9 of the inverter 85. The output of inverter 85 is applied to the gate electrodes of a p-channel MOSFET Tr4 and an n-channel MOSFET Tr6 of NOR gate 95. The output of NOR gate 95 is applied to the gate electrode of an n-channel MOSFET Tr14 for driving and controlling the liquid crystal 819.

In FIG. 12, the encircled numerals affixed to the respective elements each indicate the number in the stacking order of the active layer in which the corresponding element is formed. Thus, the first layer includes the photodiode Di. The second layer includes MOSFETs Tr1, Tr2, Tr5, Tr7, Tr10 and Tr12. The third layer includes MOSFETs Tr3, Tr4, Tr6, Tr8, Tr9, Tr11 and Tr13. The fourth layer includes MOSFET Tr14.

Figure 15:
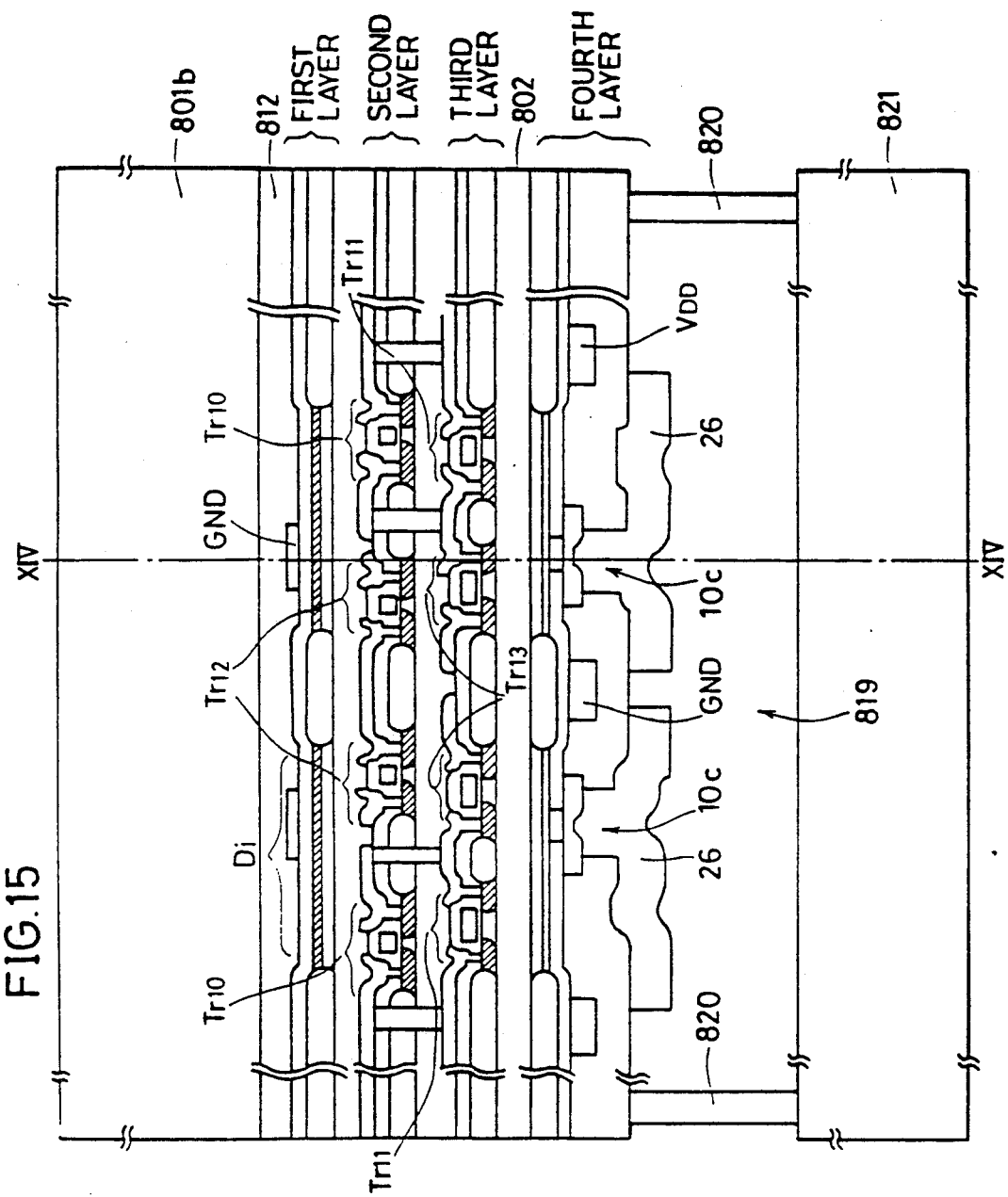

FIGS. 13A through 13D show structures of the first to fourth layers of a three-dimensional integrated circuit, respectively. FIGS. 14 and 15 show sections of the integrated circuit taken on lines XIV—XIV and XV—XV in FIGS. 13A through 13D. The three-dimensional structure of the foregoing logic circuit having a noise removing function will be described hereinafter with reference to FIGS. 12 through 15.

Figure 13A:
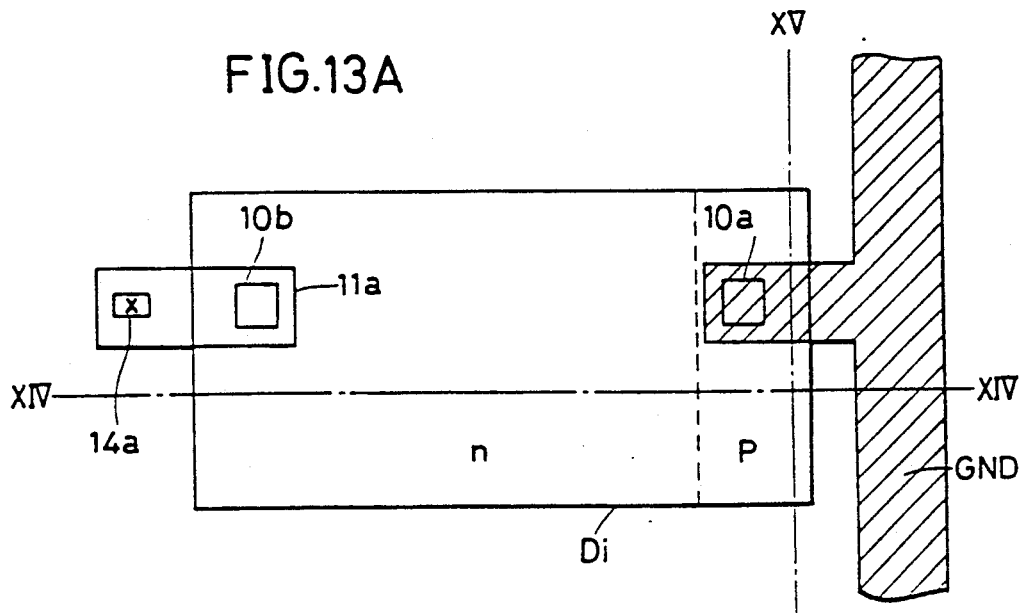
FIGS. 13A through 13D are views showing the three-dimensional structure of the circuit shown in FIG. 12, FIGS. 14 and 15 are sectional views of the three-dimensional integrated circuit taken on lines XIV and XV in FIGS. 13A through 13D.

The first layer shown in FIG. 13A has the photodiode Di comprising a pn junction. An insulating layer is formed on the photodiode Di. The photodiode Di has a p-region connected to a GND line through a contact hole 10a formed in the insulating layer, and an n-region connected to a refractory metal interconnection 11. For simplicity of illustration, other contact holes are shown in small blank squares without reference numerals. The first layer defines a through hole 14a extending toward the second layer shown in FIG. 13B. The mark "x" placed in the through holes indicates that these through holes extend from the illustrated layer to the layer below, and the mark "." indicates that the through holes extend to the illustrated layer from the layer above.

Figure 13B:
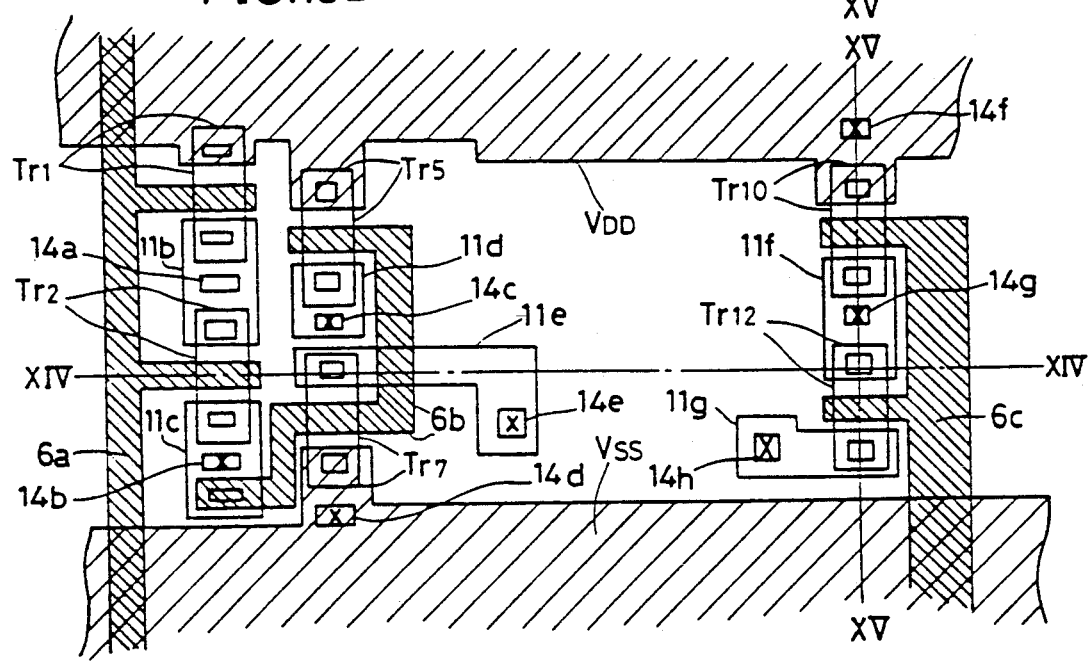

Referring to FIG. 13B, the second layer includes the p-channel MOSFETs Tr1, Tr5 and Tr10, and n-channel MOSFETs Tr2, Tr7 and Tr12.

MOSFET Tr1 is connected to a power source VDD. MOSFETs Tr1 and Tr2 are interconnected through a refractory metal interconnection 11b. the refractory metal interconnection 11b is electrically connected to the first metal interconnection 11a via the through hole 14a. Thus, MOSFETs Tr1 and Tr2 are connected to the photodiode Di via the metal interconnection 11b, through hole 14a and metal interconnection 11a. MOSFETs Tr1 and Tr2 are also connected to a gate electrode 6a which supplies the readout/precharge pulses.

MOSFET Tr2 is connected to MOSFETs Tr5 and Tr7 through a refractory metal interconnection 11c and a gate electrode 6b. MOSFET Tr5 is connected to the power source VDD and a refractory metal interconnection 11d. MOSFET Tr7 is connected to a refractory metal interconnection 11e and a grounded VSS line. MOSFET Tr10 is connected to the power source VDD and to MOSFET Tr12 through a refractory metal interconnection 11f. MOSFET Tr12 is connected to a refractory metal interconnection 11g. MOSFETs Tr10 and Tr12 are connected to a gate electrode 6c which receives the output of the detection circuit 65b of pixel B.

Figure 13C:
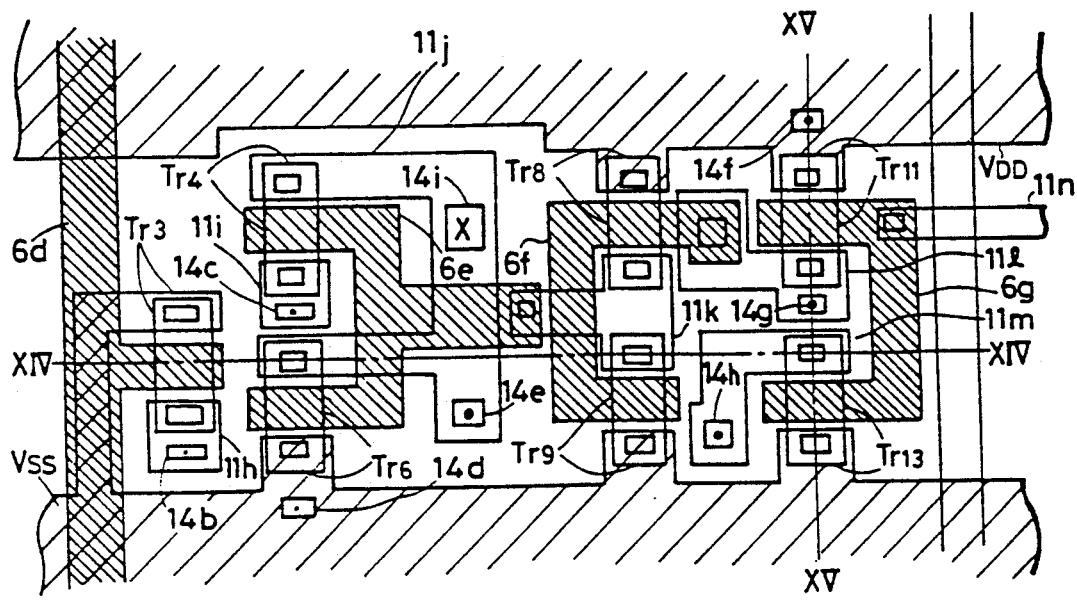

The second layer defines through holes 14b, 14c, 14d, 14e, 14f, 14c and 14h extending to the third layer shown in FIG. 13C.

Referring to FIG. 13C, the third layer includes the p-channel MOSFETs Tr4, Tr8 and Tr11, and n-channel MOSFETs Tr3, Tr6 and Tr13.

MOFSET Tr3 is connected to a refractory metal interconnection 11h, a VSS line and a gate electrode 6d which supplies the reset pulses. The metal interconnection 11h is connected via the through hole 14b to the metal interconnection 11c of the second layer. Since the metal interconnection 11c is connected to MOSFET Tr2, MOSFET Tr3 is connected to MOSFET Tr2 via the metal interconnection 11h, through hole 14b and metal interconnection 11c.

MOSFET Tr4 is connected to a refractory metal interconnection 11i, a gate electrode 6e and a refractory metal interconnection 11j. The metal interconnection 11i is connected via the through hole 14c to the metal interconnection 11d of the second layer. Since the metal interconnection 11d is connected to MOSFET Tr5, MOSFET Tr4 is connected to MOSFET Tr5 via the metal interconnection 11i, through hole 14c and metal interconnection 11d. MOSFET Tr4 is connected to MOSFET Tr6 via the metal interconnection 11j, and to the metal interconnection 11e of the second layer via the through hole 14e. Since the metal interconnection 11e is connected to MOSFET Tr7, MOSFET Tr4 is connected to MOSFET Tr7 via the metal interconnection 11j, through hole 14e and metal interconnection 11e.

MOSFET Tr6 is connected to the metal interconnection 11j, gate electrode 6e and VSS line. The VSS line of the third layer is connected to the VSS line of the second layer via the through hole 14d.

MOSFET Tr8 is connected to a VDD line, a gate electrode 6f and a refractory metal interconnection 11k. MOSFET Tr9 is connected to the refractory metal interconnection 11k, gate electrode 6f and VSS line. MOSFETs Tr8 and Tr9 are interconnection through the metal interconnection 11k. The metal interconnection 11k is connected to the gate electrode 6e of MOSFETs Tr4 and Tr6. The VDD line of the third layer is connected to the VDD line of the second layer via the through hole 14f.

MOSFET Tr11 is connected to the VDD line, a gate electrode 6g and a refractory metal interconnection 11l. The metal interconnection 11l is connected to the gate electrode 6f of MOSFETs Tr8 and Tr9, and to the metal interconnection 11f via the through hole 14g. Since the metal interconnection 11f is connected to MOSFETs Tr10 and Tr12, MOSFET Tr11 is connected to MOSFETs Tr10 and Tr12 via the metal interconnection 11l, through hole 14g and metal interconnection 11f.

Figure 13D:
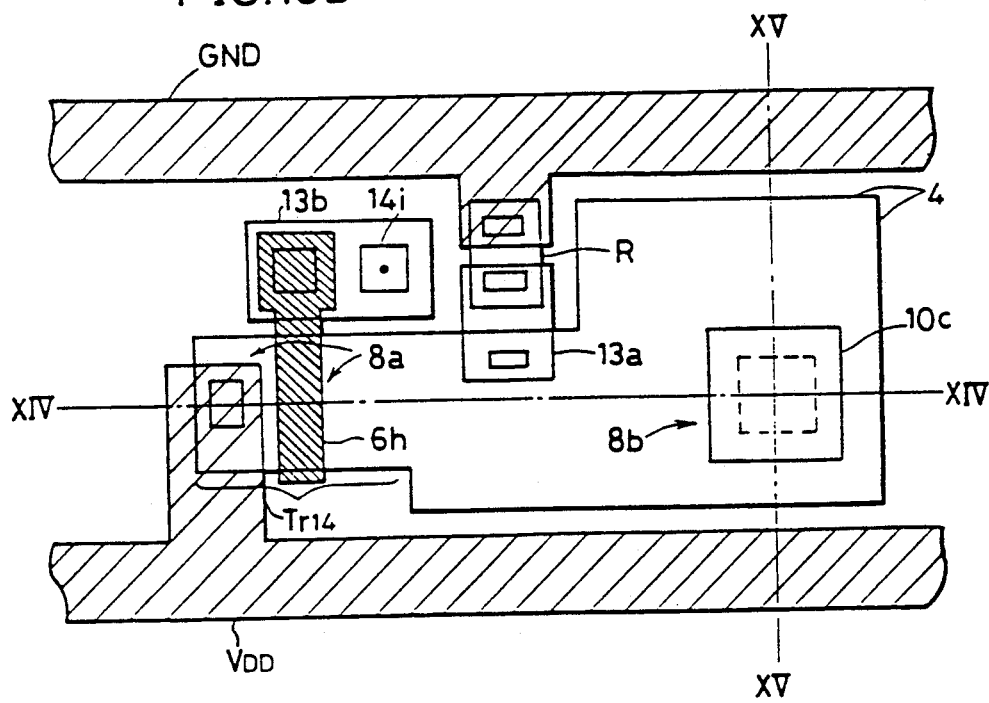

MOSFET Tr13 is connected to a refractory metal interconnection 11m, the gate electrode 6g and VSS line. The metal interconnection 11m is connected to the metal interconnection 11g of the second layer via the through hole 14h. Since the metal interconnection 11g is connected to MOSFET Tr12, MOSFET Tr13 is connected to MOSFET Tr12 via the metal interconnection 11m, through hole 14h and metal interconnection 11g. The gate electrode 6e of MOSFETs Tr11 and Tr13 is connected to a refractory metal interconnection 11n which receives the output of the detection circuit 65a of pixel A.

the third layer defines a through hole 14i extending to the fourth layer shown in FIG. 13d. FIGS. 13A through 13C depict the first through third layers as seen from above, whereas FIG. 13D depicts the fourth layer as seen from below.

Referring to FIG. 13D, the fourth layer includes an epitaxial layer 4, and a gate insulating film is formed on the epitaxial layer 4. The epitaxial layer 4 is injected with impurity ions, with a gate electrode 6h acting as a mask. Part of an impurity region 8a, gate insulating film and gate electrode 6h constitute MOSFET Tr14. MOSFET Tr14 is connected to a VDD line, the gate electrode 6h and an aluminum interconnection 13a. The gate electrode 6h is connected to an aluminum interconnection 13b which is connected via the through hole 14i to the metal interconnection 11j of the third layer. Since the metal interconnection 11j is connected to MOSFETs Tr4 and Tr6, the gate electrode 6h of MOSFET Tr14 is connected to MOSFETs Tr4 and Tr6 via the aluminum interconnection 13b, through hole 14i and metal interconnection 11j. The aluminum interconnection 13a is connected to a GND line via a resistance line R. An impurity region 8b is connected via a contact hole 10c to a transparent substrate 26 shown in FIGS. 14 and 15.

In FIGS. 14 and 15, a transparent substrate 801b is provided on the first layer through the insulating layer 812. Inter-layer insulating films are provided between the first and second layers and between the second and third layers. An insulating layer 802 is provided between the third and fourth layers. A transparent window 821 is attached to the fourth layer, as opposed to the transparent substrate 26, by means of a resin member 820. A liquid crystal 819 is contained in a space surrounded by the fourth layer, transparent window 821 and resin member 820.

The above is a specific example of the single-chip type image processing system in which a photodetecting portion, a signal processing portion including a logic circuit, and a display portion are integrated. Modified examples of the single-chip type image processing system will be described next. Description will be made first of the type of image processing system which displays only an image based on results of image processing without displaying a transmitted image of an object.

An image processing system 80a as shown in FIG. 16 employs a reflection type liquid crystal display for displaying an image by utilizing variations of reflected light. The image processing system 80a includes a transparent substrate 801b, a photosensor 816, a signal processing circuit 815, a switching circuit 818 having display driving electrodes, a liquid crystal display 819, and a transparent window 821. A reflecting film 824a is inserted between the switching circuit 818 and signal processing circuit 815 for reflecting light entering through the transparent window 821. The reflecting film comprises a refractory metal film having a high reflectance. A light shielding film 824b may be interposed between the signal processing circuit 815 and photosensor 816 in the event of leakage from the signal processing circuit 815 occurring owing to light impinging thereon. A refractory metal film is used as the light shielding film 824b.

FIG. 17A shows an image processing system 80b employing a transmission type liquid crystal display for utilizing transmission light to give a display. With this type, light must be projected from behind the liquid crystal. Thus, as shown in FIG. 17A, a light emitter 827 is disposed on a rear face of the switching circuit 818. As in the image processing system 80c shown in FIG. 17B, a film 824c of high reflectance such as a refractory metal film may be inserted between the signal processing circuit 815 and light emitter 827, if necessary, to prevent the light emitted from the light emitter 827 from jeopardizing the functions of the other electric circuits such as the signal processing circuit 815. Further, as in the image processing system 80a shown in FIG. 16, a reflecting film 824b may be inserted between the photosensor 816 and signal processing circuit 815. A color filter or filters may be provided for the photosensor 816 and/or liquid crystal 18 to give a color display.

An image processing system will be described next, which of the type that displays a transmitted image of an object and an image based on results of signal processing in superimposition.

FIG. 18 shows an image processing system 80d allowing a transmitted image of an object 25 to be seen by the naked eye 35. A liquid crystal 819 displays, in superimposition, an image based on results of signal processing such as a figure of contour lines, for example, and a transmitted image of the object 25 such as an image shown in FIG. 5, for example. This system is fabricated with pixels of a photosensor 816 and a switching circuit 818 for driving the display are positionally adjusted in advance, to enable the transmitted image and the image based on the results of signal processing to be seen as superimosed. According to this image processing system 80d, therefore, the image based on the results of signal processing may always be superimposed on the transmitted image of an object. With the image processing system 80d, a high transmittance is preferred for realizing increased brightness of the transmitted light. Where, for example, transmittance is at least 5% and 1,000 lux light is received from an object, a transmitted image of 50 lux may be seen. To increase transmittance, the image processing system 80d employs thin active layers for forming the signal processing circuit 815 and switching circuit 818, and a transparent material for interconnections which are provided in a reduced number.

Where a display device comprises light emitting elements such as light emitting diodes, it is difficult to display the transmitted image of an object. It is therefore desirable in this case to shut off the light from the object immediately below the photosensor layer. Further, since the light from the light emitting elements adversely affect the signal processing circuit, it is desirable to insert a light shielding film also between the light emitting elements constituting the display device, and the signal processing circuit. Thus, as shown in FIG. 19, light shielding films 824d and 824e having a high reflectance are inserted between the light emitter 822 and signal processing circuit 815 and between the photosensor 816 and signal processing circuit 815, respectively.

When the display device comprises light emitting elements, a sensing device having an exposed sensor may be provided. There are two reasons for this, as follows. Firstly, since the light emitting elements are solid, there is no problem in employing a substrate formed of a hard material such as quartz for supporting the light emitting elements. Secondly, since the light emitting elements have a higher heat resistance than liquid crystal, sensor elements may be formed after formation of the light emitting elements. Since the sensor may be exposed, this sensor may be the type that detects not only light but temperature, pressure or radiation.

A method of manufacturing a sensing system employing such a sensor will be described next with reference to FIGS. 20A through 20F.

Figure 20A:
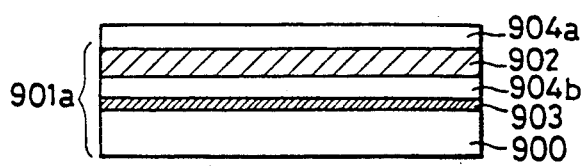
FIGS. 20A through 20F are sectional views showing a method of manufacturing a sensing system embodying this invention.

Referring first to FIG. 20A, an insulating layer 902 having a thickness of 1,000 to 10,000Å is formed on a semiconductor substrate 900 having a thickness of 500 to 600 $\mu$m. On an upper and a lower surfaces of the insulating layer 902 are low concentration epitaxial layers 904a and 904b having an impurity concentration not exceeding $1 \times 10^{19}$/cm$^3$. Each epitaxial layer 904a or 904b has a thickness on the order of 5,000Å. The substrate 900 comprises a silicon substrate, for example. Between the epitaxial layer 904b and substrate 900 is a high concentration impurity-doped layer 903 having an impurity concentration of at least $1 \times 10^{19}$/cm$^3$. As will be described later, active layers are formed on the epitaxial layers 904a and 904b in vertically opposite directions.

The structure shown in FIG. 20A is obtained by bonding, by the method shown in FIGS. 1A through 1C, a first wafer 901a having the insulating layer 902, epitaxial layer 904b and high concentration impurity-doped layer 903, and a second wafer having the epitaxial layer 904a and a high concentration impurity-doped layer, and thinning the second wafer.

Figure 20B:
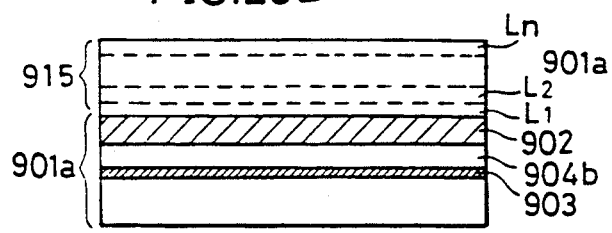

Referring to FIG. 20B next, a signal processing circuit 915 is formed on the insulating layer 902, using the epitaxial layer 904a as a base. The signal processing circuit 915 may comprise a two-dimensional integrated circuit, but preferably is a three-dimensional integrated circuit including active layers L1, L2, . . . Ln, for example. The three-dimensional integrated circuit may be formed by the method described in the Background Art hereinbefore, or by the method described with reference to FIGS. 1A through 1N. This signal processing circuit 915 is intended for processing a detection signal obtained by a sensor described later. It is to be noted that the signal processing circuit 915, insulating layer 902, epitaxial layers and high concentration impurity-doped layer 903 have a very small thickness compared with that of the substrate 901a.

Figure 20C:
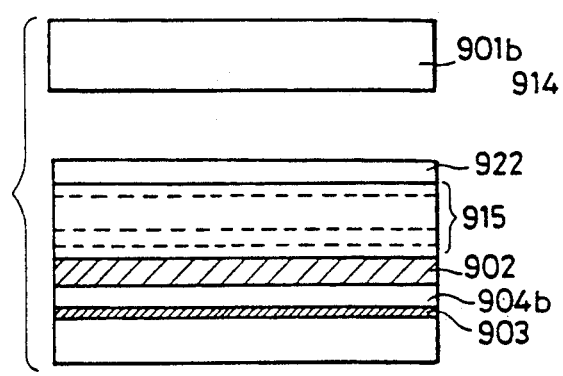
Figure 20D:
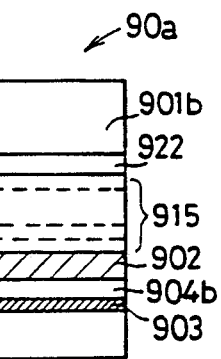

Referring to FIG. 20C, a solid display 922 comprising such as light emitting diodes is formed in the active layer Ln of the signal processing circuit 915. The display 922 and signal processing circuit 915 are electrically interconnected. Next, a substrate 901b of a transparent material such as quartz is formed on the display 922, and this structure is subjected to a heat treatment (annealing) in an atmosphere of about 400° to 800° C. As a result, the display 922 and substrate 901b are bonded together, thereby providing a structure 90a as shown in FIG. 20D. The light emitting elements are strong against heat, and will not deteriorate or become damaged during the annealing.

Next, the entire structure 90a is turned over, so that the substrate 901b faces downward. Then the upper surface of the substrate 901a is thinned by polishing and/or etching with the mixed liquid of hydrofluoric acid and nitric acid. The substrate 901a is further etched with the aqueous solution of ethylenediamine and pyrocatechol, whereby the substrate 901a is removed, leaving the insulating layer 902, high concentration impurity region 903 and epitaxial layer 904b.

Figure 20E:
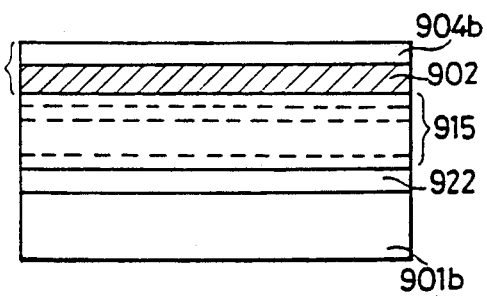
Figure 20F:
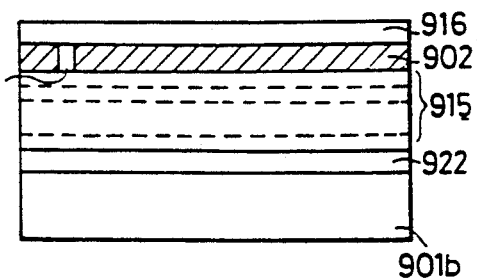

Referring to FIG. 20E next, the high concentration impurity-doped layer 903 is etched away, leaving the epitaxial layer 904 remaining on the insulating layer 902. This epitaxial layer 904 is processed to form a sensor 916 for detecting light, temperature, pressure or radiation. The sensor 916 and signal processing circuit 915 are interconnected via through holes 914 defined in the insulating layer 902. In this way, a sensing device 90b as shown in FIG. 20F is obtained.

Now, referring to FIGS. 21A to 21C, the specific structure of the sensor shown in FIG. 20F will be described.

Figure 21A:
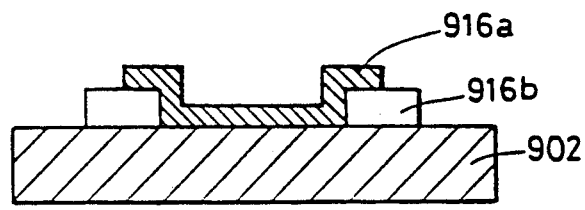
FIGS. 21A through 21C are cross-sectional views each showing a specific structure of a sensor indicated in FIG. 20F.

FIG. 21A shows a structure of a thermal sensor. In FIG. 21A, on the insulating film 902 a thermistor 916a of single crystal silicon is formed and at the opposite ends of the thermistor 916a, electrodes 916b are formed. As the value of electrical resistance in the thermistor 916a varies depending upon the ambience temperature, the temperature can be detected by applying a constant voltage to the electrodes 916b and measuring the current flow in the thermistor 916a.

Figure 21B:
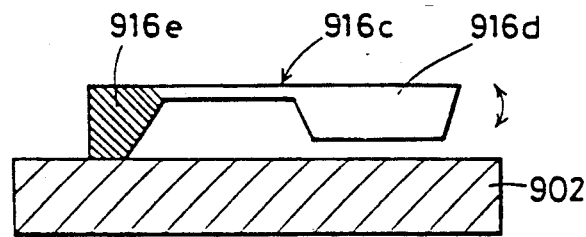

FIG. 21B shows a structure of a pressure (acceleration) sensor. In FIG. 21B, a cantilever 916c formed of silicon is fixed to the insulating film 902. End portion 916d of the cantilever 916c supports a mass. At the fixed end of the cantilever 916c, an impurity is diffused thereby forming resistance 916e. The acceleration of the cantilever 916c deforms the same, and stress acting upon the resistance 916e changes the resistance value of the resistance 916e. Taking advantage of such a characteristic, the acceleration can be detected.

Figure 21C:
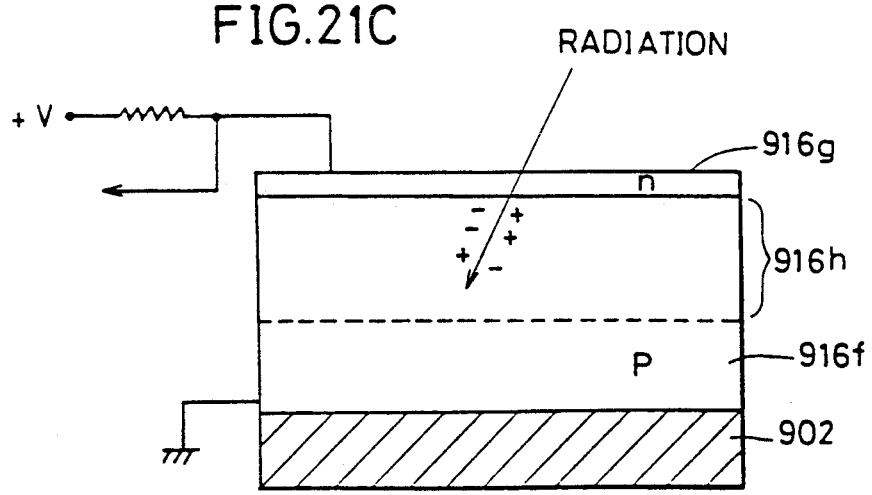

FIG. 21C shows a structure of a radiation sensor. In FIG. 21C, a p-type epitaxial layer 916f is formed on the insulating film 902 and an N+ diffusion layer 916g is formed in the surface region of the epitaxial layer 916f. When reverse bias is applied to the pn junction, a depletion layer 916h to e a region sensitive to radiation is provided. Upon incidence of radiations into the sensor, a large number of electron-hole pairs, i.e. carriers are generated in the depletion layer 916h corresponding to the energy. These carriers are pulled toward the external electrodes by high electric field existing inside the sensor and taken out as the pulses of voltages or currents. Thus, the detection of radiations and the measurement of the incident energy can be carried out.

The manner in which pads are arranged in a multi-layer type semiconductor device embodying this invention will be described next. FIG. 22A shows a pad arrangement on a top surface of the multi-layer type semiconductor device. FIG. 22B shows a pad arrangement on a bottom surface thereof. FIG. 22C is a front projection view of the semiconductor device.

As shown in FIG. 22C, a multi-layer type semiconductor device 100 comprises a substrate 1001, and a circuit section 1015 formed on one side of the substrate 1001. The circuit section 1015 includes an insulating layer 1002, and electric circuits 1015a and 1015b formed on an upper and a lower surfaces of the insulating layer 1002, respectively. The electric circuit 1015b is formed in a direction vertically opposite to a direction in which the electric circuit 1015a is formed. That is, the electric circuit 1015a is formed when the direction of arrow F is upward while the electric circuit 1015b is formed when the direction of arrow G is upward. Only pads 1031a and 1031b are formed on a top surface 100a of the multi-layer type semiconductor device 100, namely the other side of the substrate 1001. On a bottom surface 100b, the electric circuit 1015b and pads 1017c are formed. The pads 1017c are electrically connected to the electric circuit 1015b via interconnections 1013 formed of aluminum or an aluminum alloy.

The electric circuit 1015a and pads 1017a and 1017b are formed on the surface of the insulating layer 1002 opposite the surface on which the pads 1017c are formed. The pads 1017a and 1017b are electrically connected to the electric circuit 1015a via refractory metal interconnections 1011a and 101b. The electric circuits 1015a and 1015b are electrically interconnected via through holes 1014. The substrate 1001 includes a substrate 1001c and a substrate 1001d. The substrate 1001c includes conductors 1029a and 1029b electrically connected to the pads 1017a and 1017b. The substrate 1001d includes the pads 1031a and 1031b which are electrically connected to the conductors 1031a and 1029b. The pads 1031a and conductors 1029a are electrically interconnected via conductive layers 1030a.

As shown in FIG. 22A, the pad 1031b may be provided at a selected position that facilitates contact with the outside if the pads 1071b are arranged in positions difficult to make contact with the outside. The pad 1031b and a conductor 1029b are interconnected via a conductive layer 1030b.

A method of manufacturing the multi-layer type semiconductor device shown in FIGS. 22A through 22C will be described next with reference to FIGS. 23A through 23I.

Figure 23A:
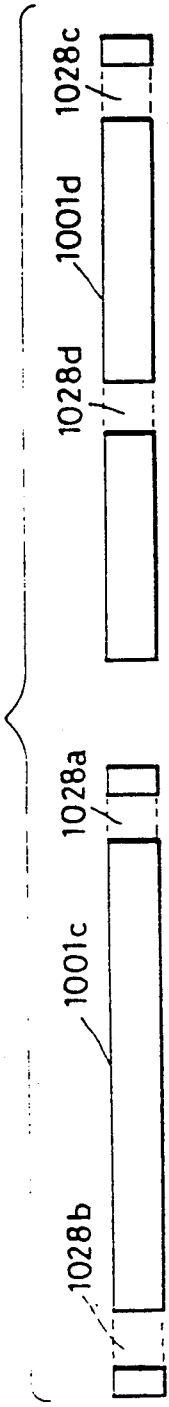
FIGS. 23A through 23I are sectional views showing a method of manufacturing the multi-layer type semiconductor device shown in FIGS. 22A through 22C.

Referring to FIG. 23A, openings 1028a, 1028b, 1028c and 1028d are formed in insulating substrates 1001c and 1001d.

Figure 23B:
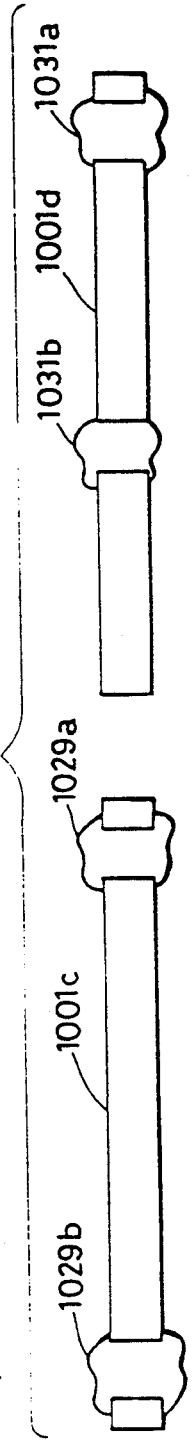

Referring to FIG. 23B next, conductors 1029a and 1029b are filled into the openings 1028a and 1028b of the substrate 1001c, and conductors 1031a and 1031b into the openings 1028c and 1028d of the substrate 1001d.

Figure 23C:
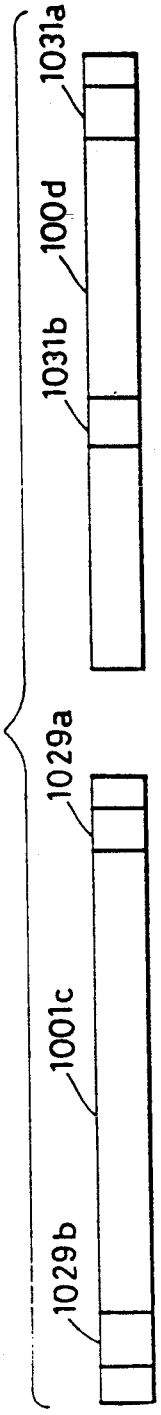

Referring to FIG. 23C next, the conductors 1029a and 1029b and conductors 1031a and 1031b are flattened by polishing. In this way, the conductors 1029a and 1029b and pads 1031a and 1031b are formed.

Figure 23E:
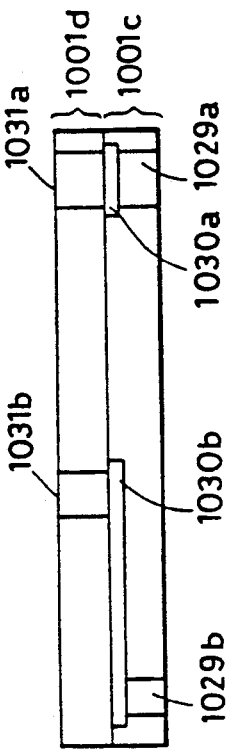
Figure 23D:
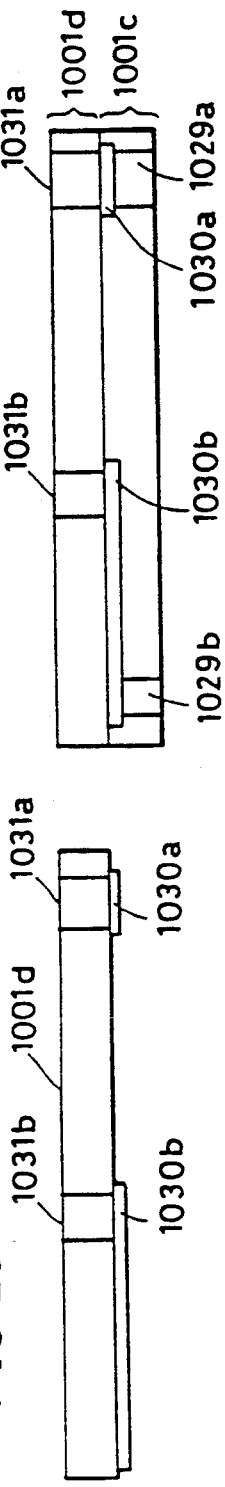

Referring to FIG. 23D next, conductive layers 1030a are patterned for connection to the pads 1031d of the substrate 1001d. Further, the conductive layer 1030b is patterned to extend to a position opposed to a conductor 1029b.

Figure 23F:
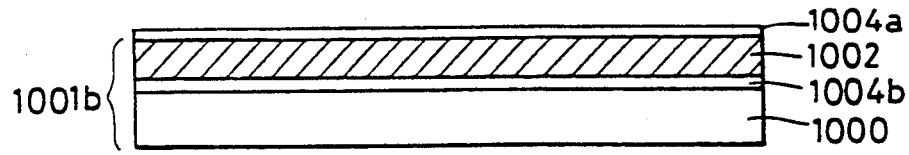

Referring to FIG. 23E next, the substrate 1001c and substrate 1001d are bonded together. On the other hand, two wafers are bonded together and thinned by the method shown in FIGS. 1A through 1C, to form a semiconductor substrate as shown in FIG. 23F. In FIG.

23F, the insulating layer 1002 is formed on the semiconductor substrate 1001b, and the epitaxial layers 1004a and 1004b on the upper and lower surfaces of the insulating layer 1002.

Figure 23G:
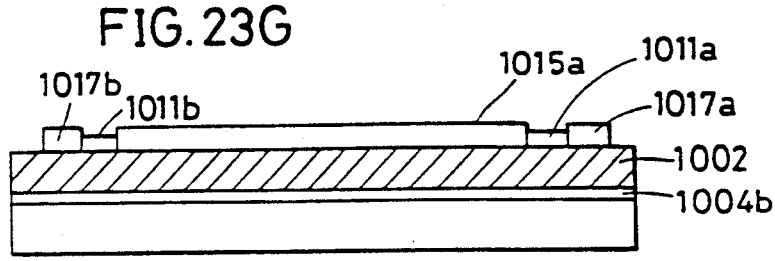

Referring to FIG. 23G next, the electric circuit 1015a is formed, using the epitaxial layer 1004 as a base. Then the refractory metal interconnections 1011a and 1011b are formed as electrically connected to the electric circuit 1015a, and the pads 1017a and 1017b are formed as connected to the metal interconnections 1011a and 1011b.

Figure 23H:
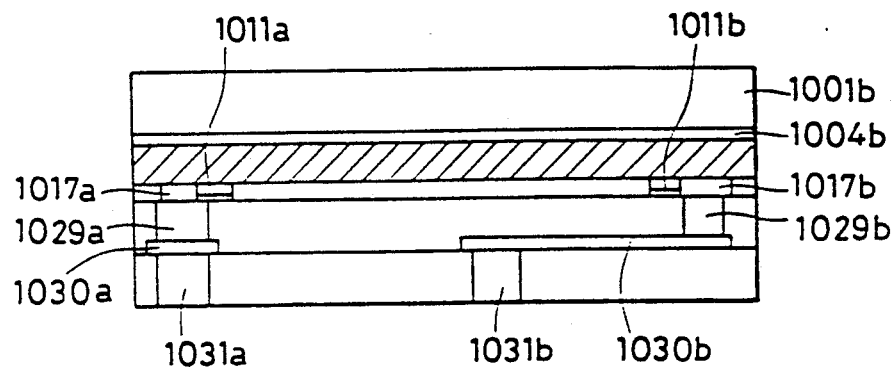

Referring to FIG. 23H next, the structure shown in FIG. 23E and the structure shown in FIG. 23G are connected together, and turned upside down.

Figure 23I:
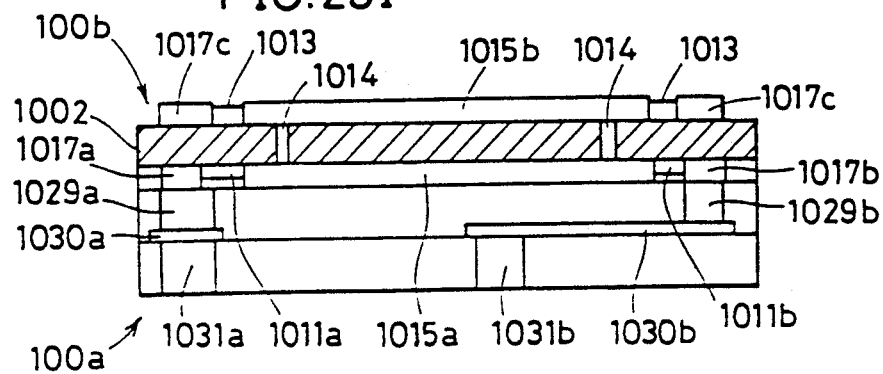
Figure 26C:
Figure 26D:
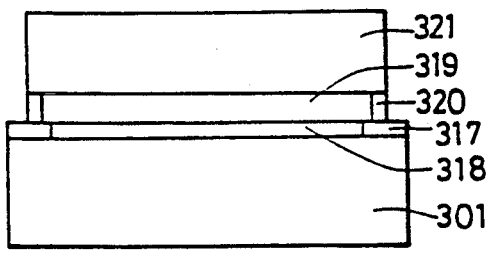
Figure 27:
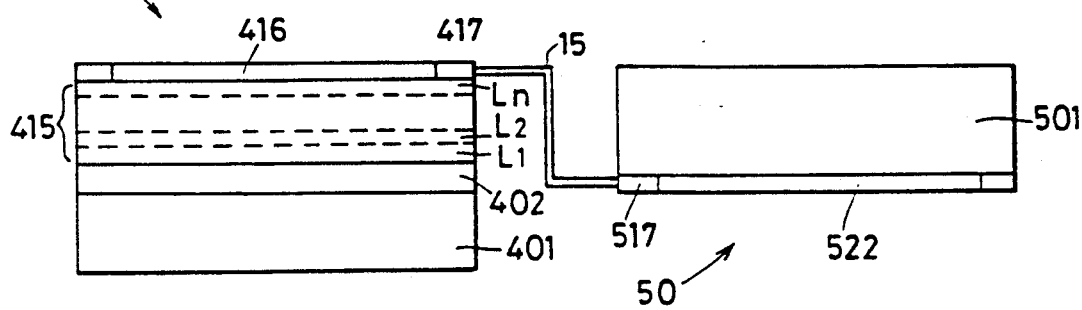
FIG. 27 is a view showing a sensing system employing the multi-layer type semiconductor device forming the background of this invention.
Figure 28A:
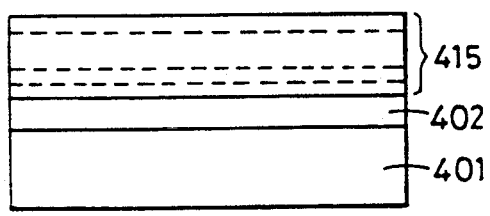
FIG. 28A through 28D are views showing a method of manufacturing the sensing system shown in FIG. 27, FIGS. 29 through 33 are views showing display modes in the image processing system and sensing system forming the background of this invention.
Figure 28B:
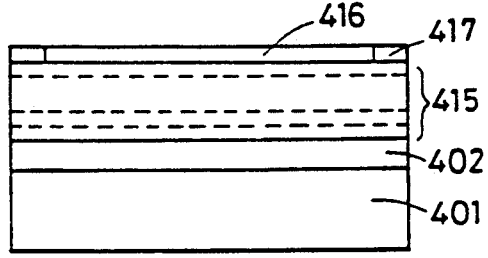
Figure 28C:
Figure 28D:
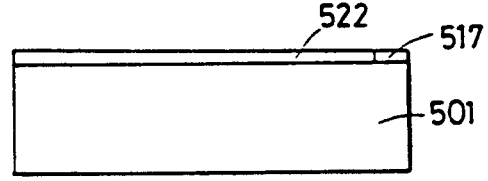
Figure 29:
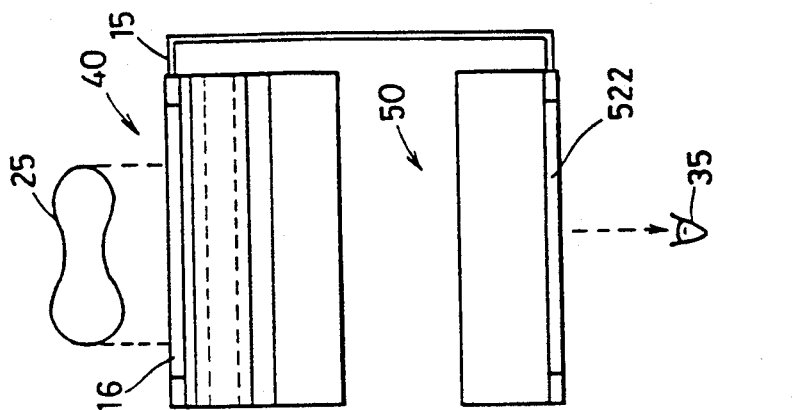
Figure 30:
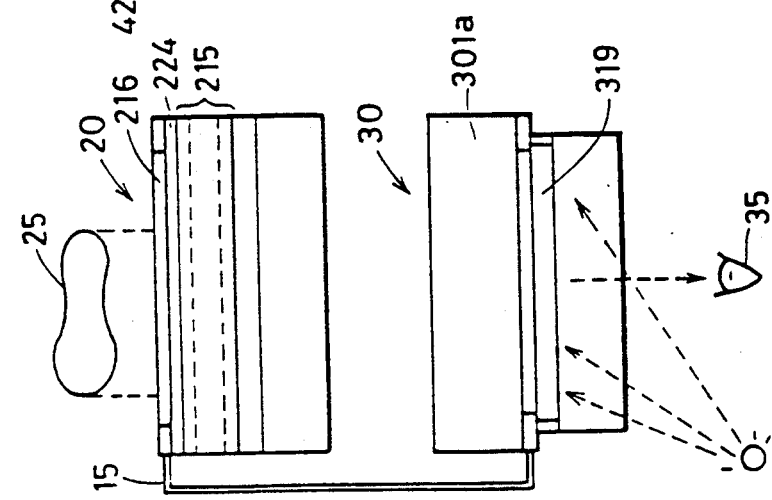
Figure 31:
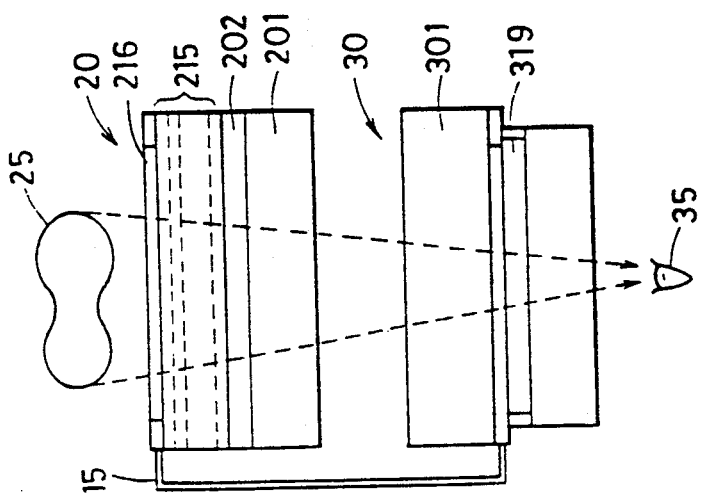
Figure 32:
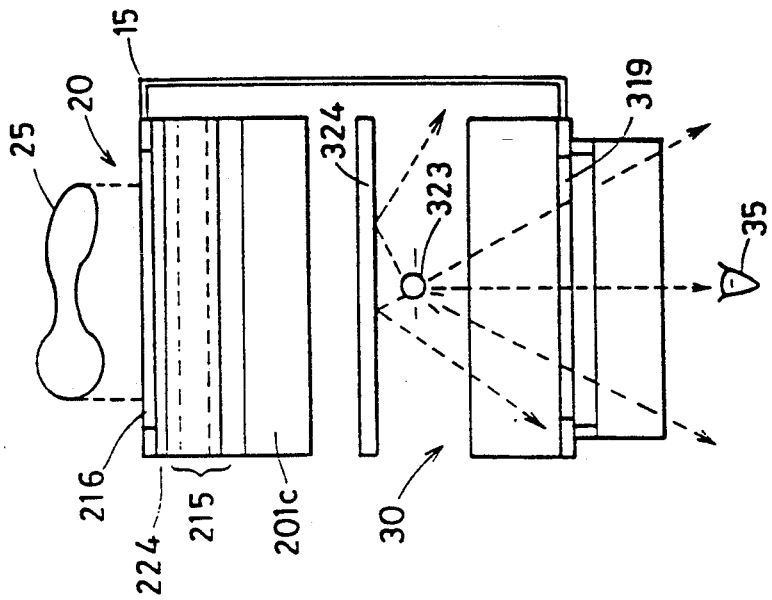
Figure 33:
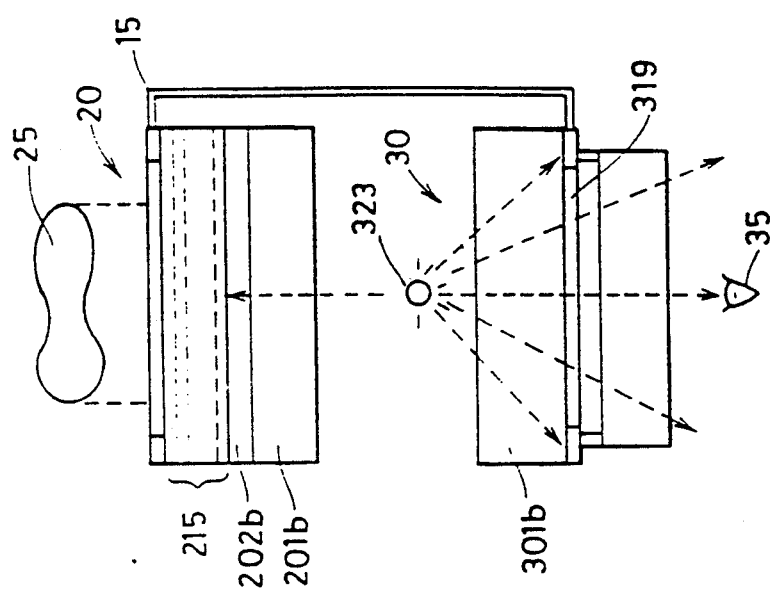
Figure 34A:
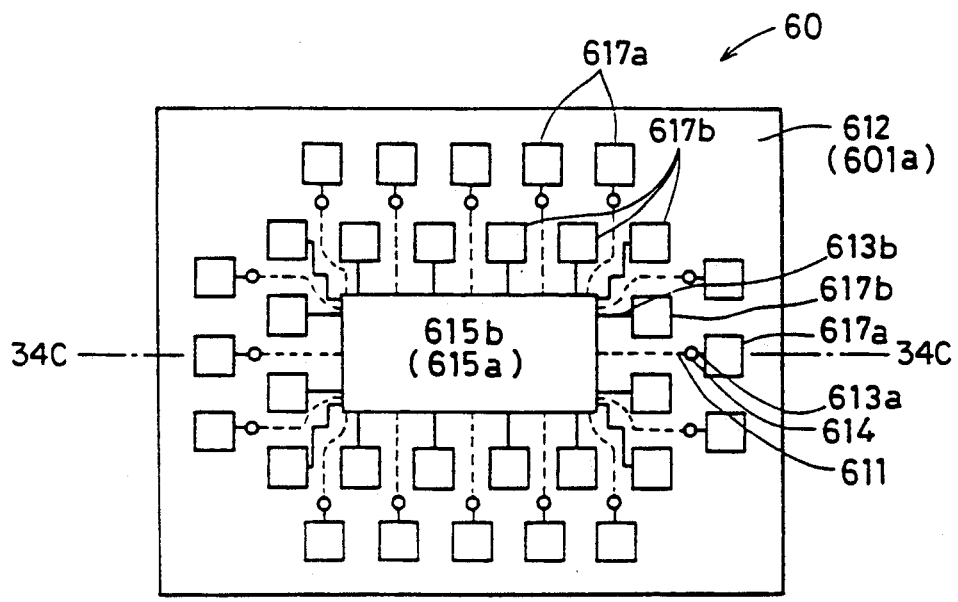
FIGS. 34A through 34C are views showing an arrangement of input and output pads in the multi-layer type semiconductor device forming the background of this invention.
Figure 34B:
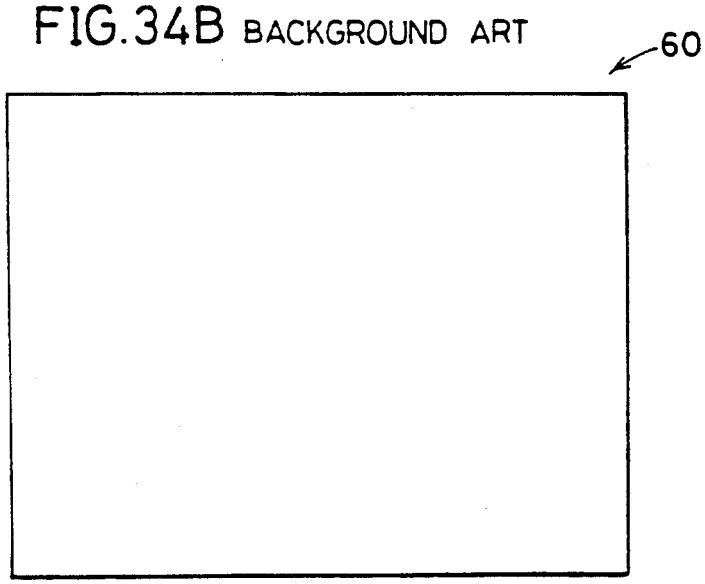
Figure 34C:
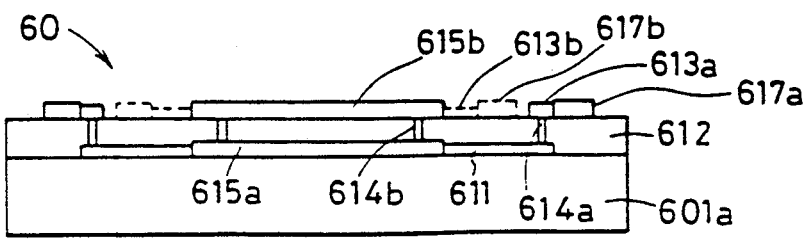
Figure 35A:
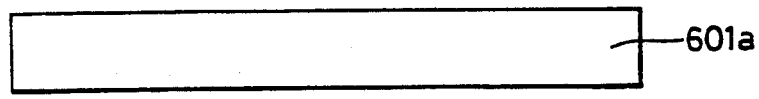
FIGS. 35A through 35E are views showing a method of manufacturing the multi-layer type semiconductor device shown in FIGS. 34A through 34C.
Figure 35B:
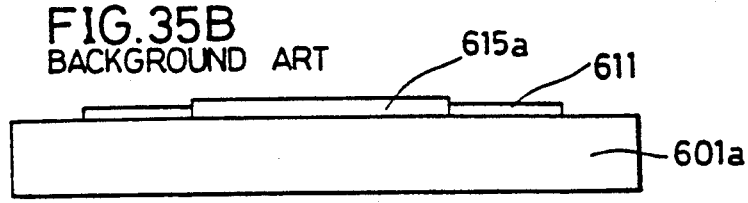
Figure 35C:
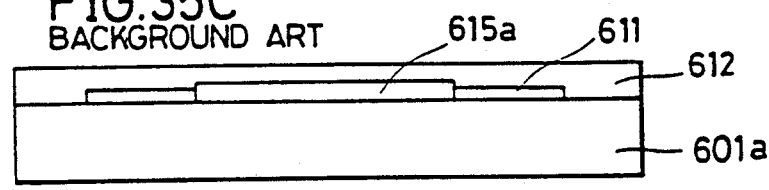
Figure 35D:
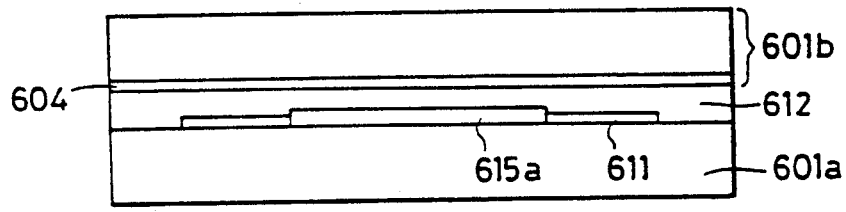
Figure 35E:
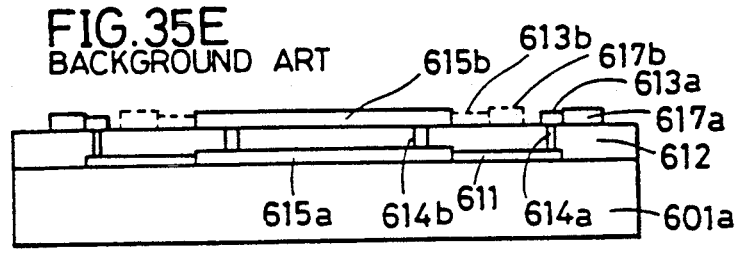

Next, the upper surface of the substrate 1001b is thinned by polishing and/or etching with the mixed liquid of hydrofluoric acid and nitric acid. The substrate 1001b is further etched with the aqueous solution of ethylenediamine and pyrocatechol, down to a high concentration impurity layer not shown. Next, the high concentration impurity layer is etched away, exposing the epitaxial layer. Next, the electric circuit 1015b is formed, using the epitaxial layer 1004b as a base. Next, the interconnections 1013 comprising aluminum or an aluminum alloy are formed as electrically connected to the electric circuit 1015b, and pads 1017c as electrically connected to the interconnections 1013. This results in a multi-layer type semiconductor device as shown in FIG. 23I. In the semiconductor device thus formed, the pads are arranged on both surfaces of a chip, and hence a large number of pads may be provided.

The substrate 1001 comprises two substrates in the above embodiment, but may of course comprise a single substrate. In this case, the conductive layer 1030b may be formed on the upper surface of the substrate 1001c or may be embedded in the substrate 1001c.

As described hereinbefore, a plurality of semiconductor element layers are not stacked in one direction but stacked in vertically opposite directions, and therefore little distortion results from a multi-layer structure. Consequently, there occurs no variation in the threshold current or an increase in leakage with the multi-layer semiconductor device. Since semiconductor element layers are formed on opposite surfaces of an insulating layer, the semiconductor layers formed at opposite ends undergo heat treatments with a reduced frequency. This allows an image processing system or a sensing system having sensor elements, display elements or the like which are vulnerable to heat to be integrated on a single chip. Compactness of such a system is promoted since it can be formed on a single chip. Moreover, since a sensor can be exposed, a single-chip type sensing system may be obtained which is capable of detecting temperature, pressure or radiation, let alone light.

The respective semiconductor layers are interconnected via through holes to be capable of communicating signals within a short time. Numerous signals may be processed at high speed where signals are transferred in a parallel mode.

An increased number of signal outlets (pads) may be formed since both surfaces of a chip are used for forming such.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a multi-layer type semiconductor device comprising the steps of;

forming a base member by successively stacking, on a main surface of a first substrate, a first semiconductor layer, an insulating layer and a second semiconductor layer, with said second semiconductor layer having a surface exposed outwardly, forming a semiconductor device by using said second semiconductor layer as a base with the exposed surface of said second semiconductor layer directed upward, forming an insulating film on said semiconductor device, attaching a second substrate to said insulating film, thinning said first substrate to expose said first semiconductor layer, and forming a further semiconductor device by using said first semiconductor layer as a base with an exposed surface of said first semiconductor layer directed upward.

2. A method of manufacturing a multi-layer type semiconductor device according to claim 1, wherein the step of forming the base member includes the steps of;

bonding a first member including said first semiconductor layer formed on said first substrate, with a second member including said second semiconductor layer formed on a third substrate and said insulating layer formed on said second semiconductor layer, such that said insulating layer and said first semiconductor layer are opposed to each other, and thinning said third substrate the expose said second semiconductor layer.

3. A method of manufacturing a multi-layer type semiconductor device comprising the steps of;

forming perforations through a first substrate;

filling said perforations with conductors, successively forming a first semiconductor layer on a main surface of a second substrate, an insulating layer on said first semiconductor layer, and a second semiconductor on said insulating layer, forming a first electric circuit on said insulating layer of said second substrate by using said second semiconductor layer as a base, and first pads electrically connected to said first electric circuit, bonding said first substrate and said second substrate so as to electrically interconnect said conductors of said first substrate and said first pads of said second substrate, thinning said second substrate to expose said first semiconductor layer, and forming a second electric circuit on said insulating layer of said second substrate by using said first semiconductor layer as a base, and second pads electrically connected to said second electric circuit.

* * * * *